United States Patent
Ge et al.

(10) Patent No.: US 11,239,949 B2
(45) Date of Patent: Feb. 1, 2022

(54) APPARATUS AND METHODS FOR POLAR CODE CONSTRUCTION AND CODING

(71) Applicant: HUAWEI TECHNOLOGIES CO., LTD., Guangdong (CN)

(72) Inventors: Yiqun Ge, Kanata (CA); Hamid Saber, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 48 days.

(21) Appl. No.: 16/225,128

(22) Filed: Dec. 19, 2018

(65) Prior Publication Data

US 2019/0268094 A1 Aug. 29, 2019

Related U.S. Application Data

(60) Provisional application No. 62/634,278, filed on Feb. 23, 2018.

(51) Int. Cl.
*H03M 13/29* (2006.01)
*H04L 1/00* (2006.01)
(Continued)

(52) U.S. Cl.
CPC .......... *H04L 1/0063* (2013.01); *H03M 13/09* (2013.01); *H03M 13/13* (2013.01);
(Continued)

(58) Field of Classification Search
CPC ... H04L 1/0063; H04L 1/0041; H04L 1/0013; H04L 1/0061; H04L 1/0057;
(Continued)

(56) References Cited

U.S. PATENT DOCUMENTS 8,347,186 B1 * 1/2013 Arikan .................. H03M 13/13
714/774
2010/0058153 A1 3/2010 Sethuraman
(Continued)

FOREIGN PATENT DOCUMENTS

CN 106100795 A 11/2016
CN 106888025 A 6/2017
(Continued)

OTHER PUBLICATIONS

R. Urbanke, "Polar Codes—A New Paradigm for Coding," Physics of Algorithms, Santa Fe, Sep. 2, 2009 (Year: 2009).*
(Continued)

*Primary Examiner* — Thinh D Tran

(57) ABSTRACT

Methods and apparatuses for implementing error-correction in communication systems, particularly wireless communication systems. Input bits are encoded according to a chained generator matrix to generate a codeword, and the codeword is transmitted. The chained generator matrix includes a first subset of entries corresponding to a first subset of entries in a base generator matrix for a chained polar code, and a second subset of entries that are different from a second subset of entries in the base generator matrix. A chained generator matrix could be constructed, for example, by applying a chaining matrix to the second subset of entries in the base generator matrix, to produce the second subset of entries in the chained generator matrix.

20 Claims, 19 Drawing Sheets

(51) Int. Cl.
*H03M 13/13* (2006.01)
*H03M 13/00* (2006.01)
*H04B 17/336* (2015.01)
*H03M 13/09* (2006.01)

(52) U.S. Cl.
CPC ..... *H03M 13/2927* (2013.01); *H03M 13/616* (2013.01); *H04B 17/336* (2015.01); *H04L 1/0013* (2013.01); *H04L 1/0041* (2013.01); *H03M 13/2906* (2013.01); *H04L 1/0057* (2013.01); *H04L 1/0061* (2013.01)

(58) Field of Classification Search
CPC ............... H03M 13/09; H03M 13/616; H03M 13/2927; H03M 13/13; H03M 13/2906; H03M 13/2767; H03M 13/29; H04B 17/336
See application file for complete search history.

(56) References Cited

U.S. PATENT DOCUMENTS

| | | | |
|---|---|---|---|
| 2011/0043391 | A1 | 2/2011 | Lee et al. |
| 2013/0117344 | A1* | 5/2013 | Gross ............... H03M 13/1575 708/490 |
| 2013/0283131 | A1 | 10/2013 | Tsatsaragkos et al. |
| 2014/0380114 | A1 | 12/2014 | Alexeev et al. |
| 2016/0013810 | A1 | 1/2016 | Gross et al. |
| 2020/0052719 | A1* | 2/2020 | Chaki ................. H03M 13/616 |

FOREIGN PATENT DOCUMENTS

| | | |
|---|---|---|
| CN | 107124251 A | 9/2017 |
| CN | 109565287 A | 4/2019 |

OTHER PUBLICATIONS

P. Trifonov, "Chained Polar Subcodes," SCC 2017; 11th International ITG Conference on Systems, Communications and Coding, Hamburg, Germany, 2017, pp. 1-6. (Year: 2017).*
E. Arikan, "Channel Polarization: A Method for Constructing Capacity-Achieving Codes for Symmetric Binary-Input Memoryless Channels," IEEE Transactions on Information Theory, vol. 55, No. 7, 2009, pp. 3051-3073.
A. J. Ferrus, C. Hirche and D. Poulin, "Convolutional Polar Codes", arXiv:1704.00715, Apr. 3, 2017, 25 pages.
Tal and Vardy, "List Decoding of Polar Codes", Proceedings of the 2011 IEEE International Symposium on Information Theory, Jul. 2011, 11 pages.
Mori R, Tanaka T., "Performance and Construction of Polar Codes on Symmetric Binary-Input Memoryless Channels", IEEE International Symposium on Information Theory, 2009, pp. 1496-1500.
J.Dai, K.Niu, Z.Si, J.Lin, "Evaluation and Optimization of Gaussian Approximation for Polar Codes", May 2016, 4 pages.
P. Trifonov, "Efficient Design and Decoding of Polar Codes." IEEE Transactions on Communications 60.11 (2012): pp. 3221-3227.
R1-1611254, "Details of the Polar Code Design", Huawei & HiSilicon, 3GPP TSG RAN WG1 Meeting #87, Nov. 10-14, 2016, 33 pages.
R1-1700089, "Performance of polar codes for control channel", Huawei & HiSilicon, 3GPP TSG RAN WG1 Ad-Hoc Meeting, Jan. 16-20, 2017, 6 pages.
R. Urbanke, Polar Codes —A New Paradigm for Coding. Physics of Algorithms, Santa Fe, Sep. 2, 2009, 123 pages.

* cited by examiner $$G_2 = \begin{bmatrix} 1 & 0 \\ 1 & 1 \end{bmatrix} \leftarrow 100$$

$$G_2^{\otimes 2} = \begin{bmatrix} G_2 & 0 \\ G_2 & G_2 \end{bmatrix}$$

$$G_2^{\otimes 2} = \begin{bmatrix} 1 & 0 & 0 & 0 \\ 1 & 1 & 0 & 0 \\ 1 & 0 & 1 & 0 \\ 1 & 1 & 1 & 1 \end{bmatrix} \leftarrow 102$$

$$G_2^{\otimes 3} = \begin{bmatrix} G_2 & 0 & 0 & 0 \\ G_2 & G_2 & 0 & 0 \\ G_2 & 0 & G_2 & 0 \\ G_2 & G_2 & G_2 & G_2 \end{bmatrix}$$

$$G_2^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \leftarrow 104$$

FIG. 1

APPARATUS AND METHODS FOR POLAR CODE CONSTRUCTION AND CODING

CROSS-REFERENCE TO RELATED APPLICATION

The present application is related to, and claims the benefit of, U.S. Provisional Application Ser. No. 62/634,278, entitled "APPARATUS AND METHODS FOR POLAR CODE CONSTRUCTION AND CODING", and filed on Feb. 23, 2018, the entire contents of which are incorporated herein by reference.

FIELD

The present disclosure relates to generally to communications and, in particular, to construction of polar codes and coding.

BACKGROUND

Polar codes are proposed as channel codes for use in future wireless communications, and have been selected for uplink and downlink enhanced Mobile Broadband (eMBB) control channel coding for the new $5^{th}$ Generation (5G) air interface, also known as the 5G New Radio (NR). These codes are competitive with state-of-the-art error correction codes and have low encoding complexity. See E. Arikan, "Channel polarization: A method for constructing capacity-achieving codes for symmetric binary-input memoryless channels," IEEE Trans. Inf. Theory, vol. 55, no. 7, pp. 3051-3073, 2009. Successive Cancellation (SC) decoding and its extensions (e.g., SC List decoding) are effective and efficient options for decoding polar coded information.

Based on channel polarization, Arikan designed a channel code that is proven to reach channel capacity. Polarization refers to a coding property that, as code length increases to infinity, bit-channels also referred to as sub-channels polarize and their capacities approach either zero (completely noisy channel) or one (completely perfect channel). In other words, bits encoded in high capacity sub-channels will experience a channel with high Signal-to-Noise Ratio (SNR), and will have a relatively high reliability or a high likelihood of being correctly decoded, and bits encoded in low capacity sub-channels will experience a channel with low SNR, and will have low reliability or a low possibility to be correctly decoded. The fraction of perfect bit-channels is equal to the capacity of this channel.

SUMMARY

Illustrative embodiments are disclosed herein by way of example.

According to one aspect of the present disclosure, a method for error-correction enabled communication involves encoding input bits according to a chained generator matrix to generate a codeword, and transmitting the codeword. The chained generator matrix includes a first subset of entries corresponding to a first subset of entries in a base generator matrix for a chained polar code, and a second subset of entries that are different from a second subset of entries in the base generator matrix.

A non-transitory processor-readable medium stores instructions which, when executed by one or more processors, cause the one or more processors to perform such a method, including encoding input bits according to a chained generator matrix to generate a codeword and transmitting the codeword, with the chained generator matrix including a first subset of entries corresponding to a first subset of entries in a base generator matrix for a chained polar code, and a second subset of entries that are different from a second subset of entries in the base generator matrix.

An apparatus includes a processor and a memory coupled to the processor. The memory stores instructions which, when executed by the processor, cause the processor to perform such a method, including encoding input bits according to a chained generator matrix to generate a codeword and transmitting the codeword, with the chained generator matrix including a first subset of entries corresponding to a first subset of entries in a base generator matrix for a chained polar code, and a second subset of entries that are different from a second subset of entries in the base generator matrix.

Another embodiment relates to an apparatus for error-correction enabled communication. The apparatus includes an encoder to encode input bits according to a chained generator matrix to generate a codeword, and a transmitter, coupled to the encoder, to transmit the codeword. The chained generator matrix includes a first subset of entries corresponding to a first subset of entries in a base generator matrix for a chained polar code, and a second subset of entries that are different from a second subset of entries in the base generator matrix.

Other aspects and features of embodiments of the present disclosure will become apparent to those ordinarily skilled in the art upon review of the following description.

BRIEF DESCRIPTION OF THE DRAWINGS

Examples of embodiments will now be described in greater detail with reference to the accompanying drawings.

FIG. 1 is a diagram showing one example of how a polar coding generator matrix can be produced from a kernel.

DETAILED DESCRIPTION

FIG. 1 is a diagram showing, by way of an illustrative example, how a polar coding generator matrix can be produced from a kernel $G_2$ 100. Note that FIG. 1 is an example. Other forms of kernel are also possible.

A polar code can be formed from a Kronecker product matrix based on a seed matrix $F=G_2$ 100. For a polar code having codewords of length $N=2^m$, the generator matrix is $G_2^{\otimes m}$. The 2-fold Kronecker product matrix $G_2^{\otimes 2}$ 102 and the 3-fold Kronecker product matrix $G_2^{\otimes 3}$ 104 in FIG. 1 are examples of polar coding generator matrices. The generator matrix approach illustrated in FIG. 1 can be expanded to produce an m-fold Kronecker product matrix $G_2^{\otimes m}$.

Figures 2, 3:
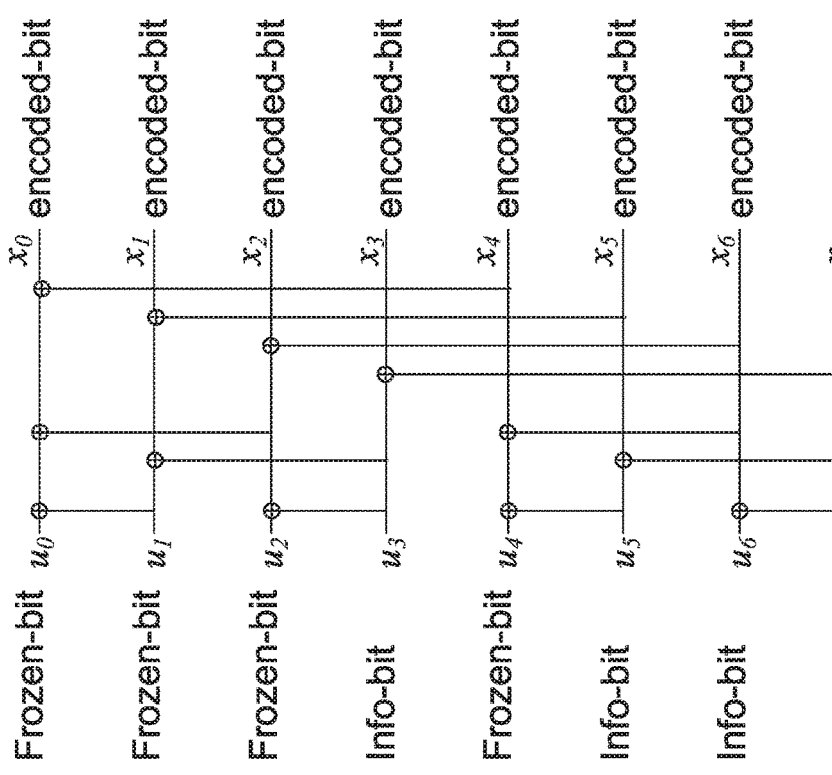
FIGS. 2 and 3 show an example use of a polar coding generator matrix for producing codewords and a schematic illustration of an example polar encoder.

FIGS. 2 and 3 show an example use of a polar coding generator matrix for producing codewords and a schematic illustration of an example polar encoder. In FIG. 2, the generator matrix $G_2^{\otimes 3}$ 104 is used to produce codewords of length $2^3=8$. A codeword x is formed by the product of an input vector $u=[0\ 0\ 0\ u_3\ 0\ u_5\ u_6\ u_7]$ and the generator matrix $G_2^{\otimes 3}$ 104 as indicated at 200. The input vector u is composed of information bits and fixed or frozen bits. In the specific example shown in FIGS. 2 and 3, N=8, so the input vector u is an 8-bit vector, and the codeword x is an 8-bit vector. The input vector has frozen bits in positions 0,1,2 and 4, and has information bits at positions 3,5,6, and 7. An example implementation of an encoder that generates codewords is indicated in FIG. 3 at 212, where the frozen bits are all set to 0, and the circled "+" symbols represent modulo 2 addition. For the example of FIGS. 2 and 3, an N=8-bit input vector is formed from K=4 information bits and N−K=4 frozen bits. Codes of this form are referred to as polar codes and the encoder is referred to as a polar encoder. Decoders for decoding polar codes are referred to as polar decoders. Frozen bits are set to zero in the example shown in FIGS. 2 and 3. However, frozen bits could be set to other bit values that are known to both an encoder and a decoder. For ease of description, all-zero frozen bits are considered herein, and may be generally preferred.

As is known, polar coding may be performed with or without bit reversal. The example polar encoder in FIG. 3 is without bit reversal.

Generally, the output of a polar encoder can be expressed as $x_0^{N-1}=u_0^{N-1}G_N$, where, without bit reversal, $G_N=F^{\otimes n}$ is an N-by-N generator matrix, $N=2^n$, $n \geq 1$ (e.g. for n=1, $G_2=F$ (indicated as 100 in FIG. 1)). For bit reversal, $G_N=B_N F^{\otimes n}$, where $B_N$ is an N-by-N bit-reversal permutation matrix.

Embodiments disclosed herein could be implemented without or with bit reversal.

In polar code construction, ideally the more "reliable" positions of an input vector are used to carry the information bits, and the more "unreliable" positions of an input vector are used to carry the frozen bits (i.e., bits already known to both encoder and decoder). However, when information is transmitted over a physical channel, the reliability of a given bit position is also a function of the characteristics of the physical channel, such as the erasure rate or the Signal-to-Noise Ratio (SNR) of the physical channel. A reliability sequence (reliable and unreliable positions) could be calculated based on assumed or measured characteristics of the physical channel before the information is transmitted over the channel, for example. In theory, the frozen bits can be set to any value as long as the location of each frozen bit is known to both the encoder and the decoder. In conventional applications, the frozen bits are all set to zero.

With a sufficiently long code length, a code designed according to polarization theory can reach the channel capacity in a binary symmetric memoryless channel if a Successive Cancellation (SC) decoding algorithm is used. A very simple SC decoding algorithm was analyzed and simulated by Arikan.

In practice, a code length cannot be infinite and a channel cannot be a binary memoryless channel, and therefore channel capacity cannot be reached by such a simple SC decoder. According to Arikan, the channel capacity can be approached when using SC decoding if a code length is over $2^{20}$ bits in an AWGN channel. Such a long code length is impractical in wireless communications, for example.

Assistant or error-detecting code (EDC) bits can be included in the input vector to assist in decoding. A cyclic redundancy check (CRC) code could be used as an EDC. More than one EDC could be used within one codeword. However, it should be understood that other EDCs, such as a checksum code or a Fletcher Code, may be used. Some EDCs are also error-correcting codes (ECCs).

CRC bits, for example, are generated based on the information bits being transmitted. CRC bits are generally placed in more reliable positions in the input vector, although CRC bits may also or instead be placed in other positions in the input vector. CRC bits may be used in path selection for List decoding, for example, to improve polar code performance. During encoding, an N-bit input vector could be formed from K information bits, including one or more CRC bits, and (N−K) frozen bits. In this example, starting with a number of input bits, a CRC is calculated and appended to the input bits to produce a set of K information bits including the input bits and the CRC bits. The remaining (N−K) frozen bits are inserted to produce an N-bit input vector, where N is a power of 2 in an Arikan polar code. The input vector is then multiplied by a generator matrix for a polar code to produce an N-bit codeword.

The codeword is transmitted over a channel, and a receiver, in turn, receives a word. Due to channel effects such as noise, the received word might not be identical to the transmitted codeword. A decoder attempts to decode the received word to determine information bits in the original input vector.

During decoding of a codeword encoded from an input vector, the locations and values of frozen bits in the input vector are treated as known. For descriptive simplicity, bits of the input vector that are not known to the decoder in advance will be referred to as "unknown" bits. For example, the information bits including any CRC bits are unknown bits. Some polar decoders use SC decoding as noted above, in which the unknown bits are decoded sequentially and successive cancellation is applied. Once a particular decision has been made regarding how an unknown bit is to be decoded, SC polar decoders do not allow that bit to be changed or corrected, and the decoder moves on to decoding the next unknown bit.

An extension of SC polar decoding algorithm with better error correction performance, referred to as List or SCL decoding, is described in "List Decoding of Polar Codes" by Tal and Vardy, *Proceedings of the* 2011 *IEEE International*

*Symposium on Information Theory*, pp. 1-5 (July 2011). In a List decoder, successive levels of a binary decision tree are generated, each level corresponding to a decision on a respective unknown bit. Each (decoding) path in the decision tree from the root node to leaf nodes represents a possible partial decoded sequence of unknown bits and has a corresponding likelihood. Typically, during generation of the decision tree, at each level of the decision tree where the number of paths grows beyond a set threshold L, the L paths having the highest likelihoods are identified, and the remaining paths are discarded. Some List decoders may also make use of CRC bits included in the codeword to assist in decoding. For example, if the codeword includes encoded CRC bits for the previous information bits, then once the decision tree is generated, each of the surviving paths that corresponds to decoded information bits is checked against the CRC bits represented in each of those surviving paths. The decoder then outputs as a decoded vector the information bits in the surviving path that passes the CRC check. If more than one path passes the CRC check, then the decoder selects for output the path that passes the CRC check and has the highest likelihood, which may be determined according to a metric. If no path passes the CRC check, or if the codeword does not include encoded CRC bits, then the decoder selects for output the path that has the highest likelihood, which as noted above may be determined according to a metric.

Thus, there are two types of the decoding based on successive cancellation, including SC decoding and List decoding, which is also referred to as SCL decoding. For every decoded bit, a decoding path generates 2 leaf branches (bit=0|1) for the next decoding bit. An SC decoder tracks only one decoding path. After the value of a decoded bit is estimated, the other possible value is ignored. Decoding continues with the next bit, assuming that each previous bit has been correctly estimated when updating partial sum results.

Figure 4:
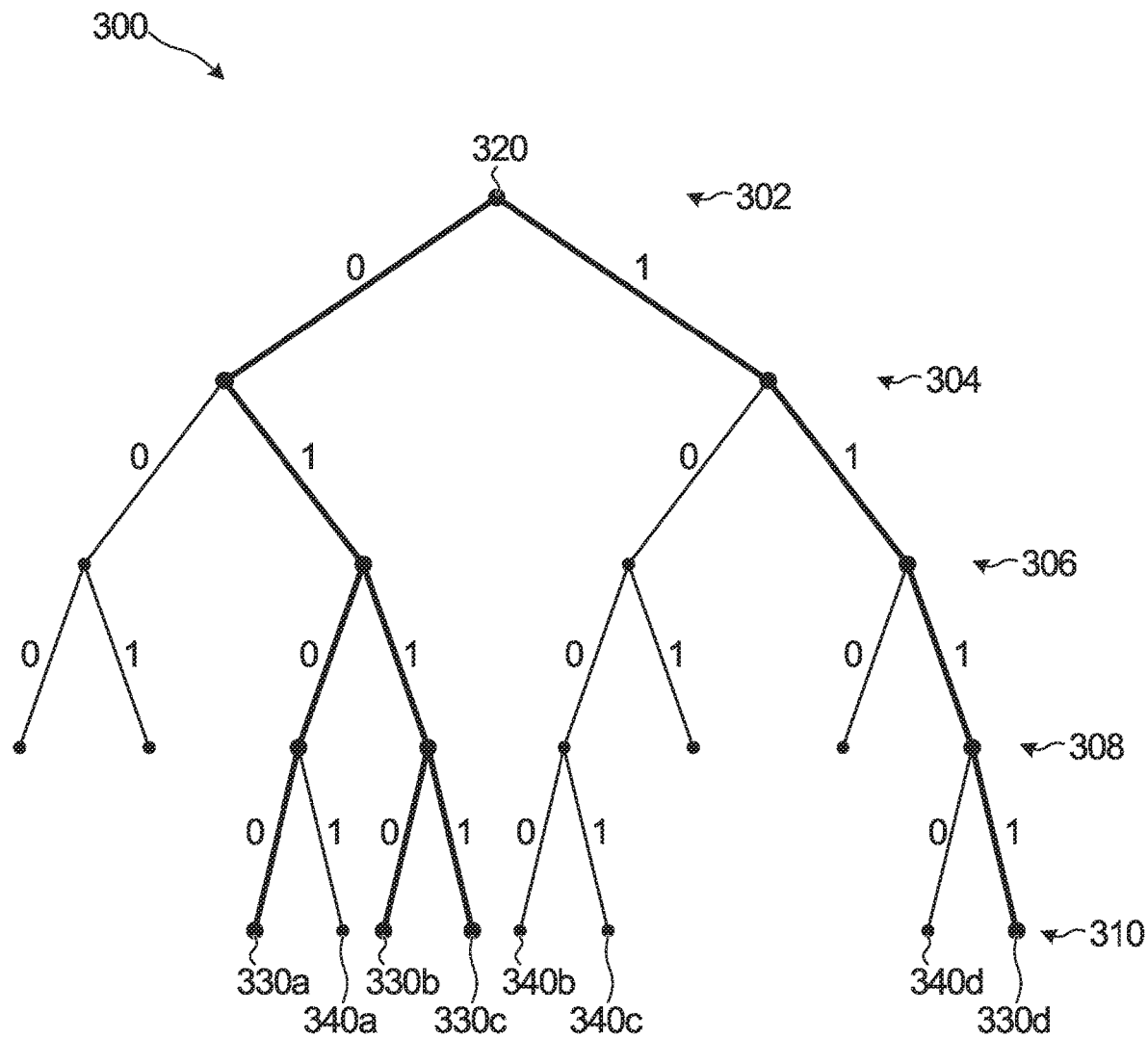
FIG. 4 is a diagram showing a portion of an example decision list tree whose width is limited by a maximum given list size and used in an SCL (Successive Cancellation List) polar decoder.

FIG. 4 is a diagram showing a portion of an example decision list tree 300 used in an SCL polar decoder, whose width is limited by a maximum given list size L. In FIG. 4 the list size L is 4. Five levels 302, 304, 306, 308, 310 of the decision tree are illustrated. Although five levels are illustrated, it should be understood that a decision tree to decode K information bits (including CRC bits) would have K+1 levels. At each level after the root level 302, each one of up to 4 surviving decoding paths is extended by one bit. The leaf or child nodes of root node 320 represent possible choices for a first bit, and subsequent leaf nodes represent possible choices for subsequent bits. The decoding path from the root node 320 to leaf node 330a, for example, represents an estimated codeword bit sequence: 0, 1, 0, 0. At level 308, the number of possible paths is greater than L, so L paths having the highest likelihood (e.g. best Path Metrics) are identified, and the remaining paths are discarded. The decoding paths that survive after the path sort at level 306 are shown in bold in FIG. 4. Similarly, at level 310, the number of possible paths is again greater than L, so the L paths having the highest likelihood (best PMs) are identified, and the remaining paths are again discarded. In the example shown, the paths terminating in leaf nodes 330a, 330b, 330c, and 330d represent the highest likelihood paths. The paths terminating in leaf nodes 340a, 340b, 340c, 340d are the lower likelihood paths which are discarded.

SCL decoding can be further divided into pure list decoding in which survivor paths with the highest likelihood are selected and CRC-Aided SCL (CA-SCL) decoding where CRC bits are used for path selection. SC decoding is a special case of pure list decoding, with list size L=1. A CRC may provide better error correction performance in the final path selection, but is optional in SCL decoding. Other decoding-assistant operations, such as a Parity Check (PC) based on parity or "PC" bits that are included in an input vector, could be used instead of or jointly with CRC bits in path selection during decoding or in the final path selection.

In an Additive White Gaussian Noise (AWGN) channel, a polar code in effect divides a channel into N sub-channels, where N is referred to as mother code length and is always is power of 2 in an Arikan polar code, which is based on a polar kernel that is a 2×2 matrix. A key to code construction for a polar code is to determine which bit-channels, also referred to herein as sub-channels, are selected or allocated for information bits and which sub-channels are allocated for frozen bits. In some embodiments, one or more sub-channels are also allocated to parity/PC, CRC, and/or other types of bits that are used to assist in decoding. In terms of polarization theory, the sub-channels that are allocated for frozen bits are called frozen sub-channels, the sub-channels that are allocated for information bits are called information sub-channels, and additional assistant sub-channels may be allocated to assistant bits that are used to assist in decoding. In some embodiments, assistant bits are considered to be a form of information bits, for which more reliable sub-channels are selected or allocated.

Figure 5:
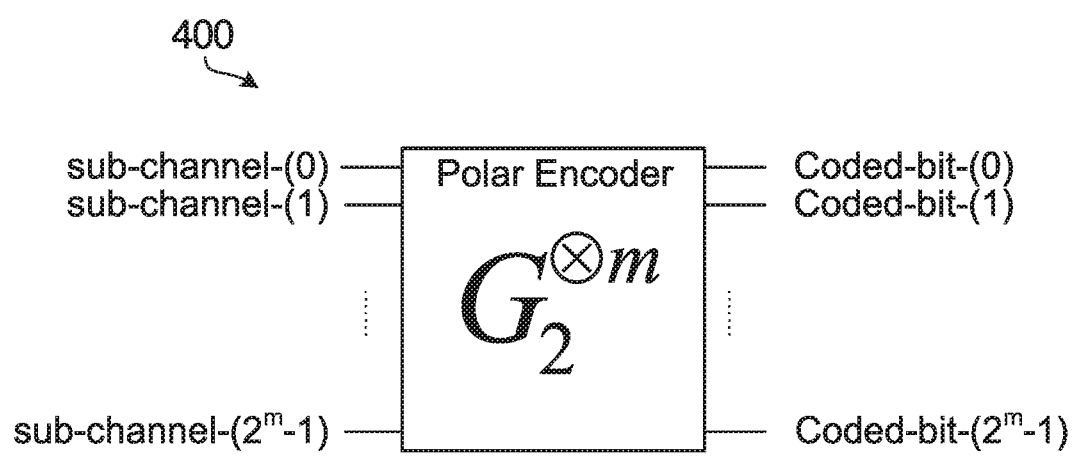
FIG. 5 is a block diagram illustrating an example of a polar encoder based on a 2-by-2 kernel.

Polar encoders based on Kronecker products of a 2-by-2 Arikan kernel $G_2$ are described above. FIG. 5 is a block diagram illustrating an example of a polar encoder 400 based on a 2-by-2 kernel. Sub-channels and coded bits are labeled in FIG. 5. A channel is divided into N sub-channels by a polar code as noted above. An information block and frozen bits are allocated onto the N sub-channels, and the resultant N-sized vector is multiplied with an N-by-N Kronecker matrix by the polar encoder 400 to generate a codeword that includes N coded bits. An information block includes at least information bits and could also include assistant bits such as CRC bits or PC bits. A sub-channel selector (not shown) could be coupled to the polar encoder 400 to select sub-channels for information bits and any assistant bits, with any remaining sub-channels being frozen sub-channels.

For polar codes that are based on a 2-by-2 kernel and an N-by-N Kronecker matrix, N is a power of 2. This type of kernel and polar codes based on such a kernel are discussed herein as illustrative examples. Other forms of polarization kernels with a different size (or number of inputs) could be generally characterized by code length $N=D^n$, where D is the dimension (i.e., size or number of inputs) of the applied kernel. In addition, polarization kernels such as other prime-number kernels (e.g. 3-by-3 or 5-by-5) or combinations of (prime or non-prime number) kernels to produce higher-order kernels could yield polarization among code sub-channels. It should also be noted that coded bit processing such as puncturing, shortening, zero padding, and/or repetition could be used in conjunction with polar codes that are based on 2-by-2 kernels or other types of kernels, for rate matching and/or other purposes for example.

As a result of SC, SCL, or CA-SCL decoding, the polarization phenomenon appears over these synthesized sub-channels. Some synthesized channels have high capacity, and some have low capacity. Put another way, some synthesized sub-channels have equivalently high Signal-to-Noise Ratio (SNR) and others have equivalently low SNR. These metrics are examples of characteristics that could be used to quantify or classify sub-channel "reliability". Other metrics indicative of sub-channel reliability could also or instead be used.

Code construction involves determining a code rate (the number of information bits K, or how many sub-channels are to carry information bits) and selecting the particular K sub-channels among the N available sub-channels that are to carry information bits. For ease of reference herein, information bits could include input bits that are to be encoded, and possibly CRC bits, PC bits, and/or other assistant bits that are used to assist in decoding. Sub-channel selection is based on reliabilities of the sub-channels, and typically the highest reliability sub-channels are selected as information sub-channels for carrying information bits.

Sub-channel reliabilities could be specified, for example, in one or more ordered sequences. A single, nested, SNR-independent ordered sequence of sub-channels could be computed for a code length $N_{max}$, with ordered sequences for shorter code lengths N being selected from the longer $N_{max}$ sequence. Multiple ordered sequences in terms of different mother code lengths $N_i$ could instead be computed, and one of the mother code length sequences could be selected for a particular code based on preferred code length. Another possible option involves computing multiple ordered sequences in terms of SNR values, for example, and selecting an ordered sequence based on measured SNR.

There are also several methods to compute sub-channel reliabilities. For example, Mori R, Tanaka T., "Performance and construction of polar codes on symmetric binary-input memoryless channels", IEEE International Symposium on Information Theory, 2009, 1496-1500, proposes a density evolution (DE) method in which the reliability of a sub-channel is measured using the decoding error probabilities of Belief Propagation decoding, which can be calculated via density evolution. The proposed method is proven to be capacity-achieving for arbitrary symmetric binary erasure channels when used for polar construction. However, because the method relies on iterative calculations of Log Likelihood Ratio (LLR) values for each sub-channel, it is computationally complex.

According to a genie-aided method proposed in E. Arikan, "Channel polarization: A method for constructing capacity-achieving codes for symmetric binary-input memoryless channels", IEEE Transactions on Information Theory, 2009, 55(7): 3051-3073, an encoder encodes on different sub-channels a training sequence that is known to the decoder. The decoder feeds back decoding results to the encoder so that the encoder can compute reliability statistics for every sub-channel, and a well-adapted reliability-vector over the sub-channels is obtained. The relative reliabilities for the sub-channels are dependent on the receiving SNR, making this method an SNR-dependent method.

Gaussian-approximation methods as proposed in J. Dai, K. Niu, Z. Si, J. Lin, "Evaluation and Optimization of Gaussian Approximation for Polar Codes", May 2016, and in P. Trifonov, "Efficient design and decoding of polar codes." IEEE Trans. on Communications 60.11 (2012): 3221-3227, assume that every coded bit is subjected to an equal error probability. From the error probability, the reliabilities over the sub-channels are obtained with a density evolution algorithm. Because this error probability on the coded bits is related to the receiving SNR, this method is also SNR-related and is computationally complex.

An SNR-independent polarization weight (PW) method is disclosed in R1-1611254, "Details of the Polar Code Design", Huawei & HiSilicon, 3GPP TSG RAN WG1 Meeting #87. In this method, the reliability of a sub-channel is measured by the corresponding beta-expansion values, which are given by a closed-form formula as a function of the binary representation of the sub-channel index. The reliability measure is SNR-independent, and can lead to a single nested ordered sub-channel sequence for different coding rates and block lengths. The sequence may be calculated offline and stored in memory for use, to provide a lower implementation and computational complexity relative to other methods.

As mentioned above, there are several ways to generate an ordered sequence (from a kernel and its generator matrix) via calculating the sub-channel reliabilities. Not every way might necessarily lead to a nested sequence, and this nested sequence might not necessarily be unique. Nested ordered sequences could be generated, for example, based on a polarization weight as disclosed in Chinese Patent Application No. CN 201610619696.5, filed on Jul. 29, 2016, or based on a Hamming weight as disclosed in U.S. Patent Application No. 62/438,565, filed on Dec. 23, 2016, both of which are entirely incorporated herein by reference. Other techniques could also or instead be used.

Ordered sequence computations can be performed in a number of different ways. For example, the computations could be performed online, producing ordered sequences that can be dynamically adjusted or recomputed based on, for example, observed channel conditions. The computations may alternatively be performed offline (i.e. in advance) to produce pre-computed (and static) ordered sequences that can be stored and retrieved during subsequent coding operations. In yet another alternative, the computations may be performed partially online and partially offline.

In mobile wireless communications, the channel conditions may significantly vary in time. It may be impractical to use online sequence computing methods with high computational complexity (e.g. genie-aided, DE and GA-based methods) because those methods may consume significant communication bandwidth and processing resources. Computationally complex methods, such as Genie-aided, DE and/or GA-based methods, are generally performed offline instead to produce multiple static ordered sequences, for example, by fixing a working SNR or reference SNR for different combinations of code length and code rate. However, simple online sequence generation methods such as those disclosed in U.S. Patent Application No. 62/463,128 entitled "APPARATUS AND METHODS OF SPECIFYING ORDERED SEQUENCES OF CODING SUB-CHANNELS" filed on Feb. 24, 2017 and/or in U.S. patent application Ser. No. 15/889,544 filed on Feb. 6, 2018 claiming the benefit thereof, each of which is incorporated herein by reference in its entirety, may still be preferred, in that they generally consume less memory, and may be more flexible and adaptive to time-varying wireless channel conditions.

An Arikan code has been adopted for 5G NR control channel coding, as mentioned above. The selected code has better coding performance (about 2.0 dB gain) over TBCC for small block sizes.

An Arikan polar code with code length $N=2^n$ and a binary kernel $$F = \begin{bmatrix} 1 & 0 \\ 1 & 1 \end{bmatrix}$$

as described by way of example above is a linear block code generated by the row space of the generator matrix:

$$G_N = \begin{bmatrix} G_{N/2} & 0 \\ G_{N/2} & G_{N/2} \end{bmatrix}.$$

Let A be a set of size K containing a subset of row indices of $G_N$. This set could be referred to as the information set. The complementary set of size N−K could be referred to as the frozen set. Let $u=[u_1, \ldots, u_N]$ be an input bit vector. To encode a set of K information bits, the information bits are placed into those elements of u corresponding to the set A, and deterministic zero-valued (or other known-valued) bits are placed into the remaining elements. A codeword $c=[c_1, \ldots, c_N]$ is then calculated as $$c=uG_N.$$

Different decoding algorithms for Arikan polar codes are also described by way of example above. SC decoding is the simplest under which the capacity achieving property of polar codes is proven. Although polar codes are capacity-achieving under SC decoding, their performance at finite code length is not as promising. SCL decoding may improve performance at finite code length. CA-SCL decoding algorithms are also proposed for polar codes. Polar codes with CA-SCL decoding have emerged as strong competitors to Turbo and Low Density Parity Check (LDPC) codes.

The decoding complexity and latency of an Arikan polar code is directly related to list size of an SCL decoding implementation. The $3^{rd}$ Generation Partnership Project (3GPP) has assumed a maximum List size of 8 by allocating 3 extra CRC bits to guarantee a False-Alarm-Rate (FAR), of the NR-PDCCH (Physical Downlink Control Channel), that is equal to a limitation on coding performance by a List-8 decoder.

The limitation is due primarily to the complexity and latency penalty paid for ranking L survivors from 2L candidate paths at each information bit. Complexity is 0(2LK log(2L)) where L is list size and K is the number of information bits. Moreover, an SC-based decoder does not actually process information bits until L survival candidates are selected from the 2L candidates during decoding of any particular bit.

Due to this limitation, an Arikan polar code is proposed only for small blocks (smaller K) and is assumed to use an L<=8 decoder in current 5G NR standardization.

One solution to further enhance coding gain without increasing list size is to optimize an encoder. Encoder optimization could focus, for example, on a kernel in an effort to increase polarization, and/or on bit allocation for a rate-matching scheme in an effort to decrease the performance penalty associated with SCL decoding. However, any change to a polarization kernel would fundamentally reshape characteristics of a polar code, especially reliability distributions that are strongly relevant to allocation of K information bits on the K most reliable bit positions according to a rate-matching scheme. Some embodiments therefore relate to an optimization of the polarization kernel and its dynamic bit allocation.

The present disclosure contemplates "chained" polar coding using chained polar codes. These codes are also referred to as "convolutional" polar codes or Branching MERA codes. See, for example, A. J. Ferrus and D. Poulin, "Branching MERA codes: A natural extension of classic and quantum polar codes", in Proc. Intl Symp. Inf. Theory (ISIT) 2014, Honolulu, Hi., USA, June 2014.

Figure 6:
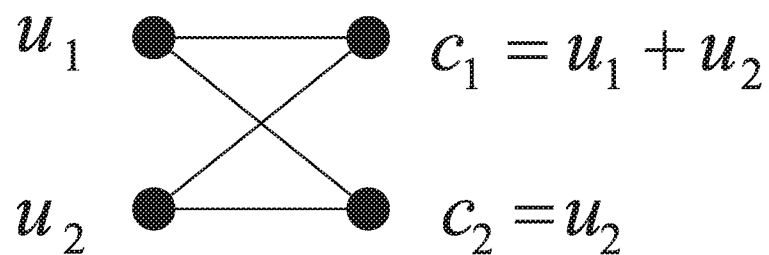
FIG. 6 is an example graph representation of a butterfly operation corresponding to a 2-by-2 Arikan kernel.
Figure 7:
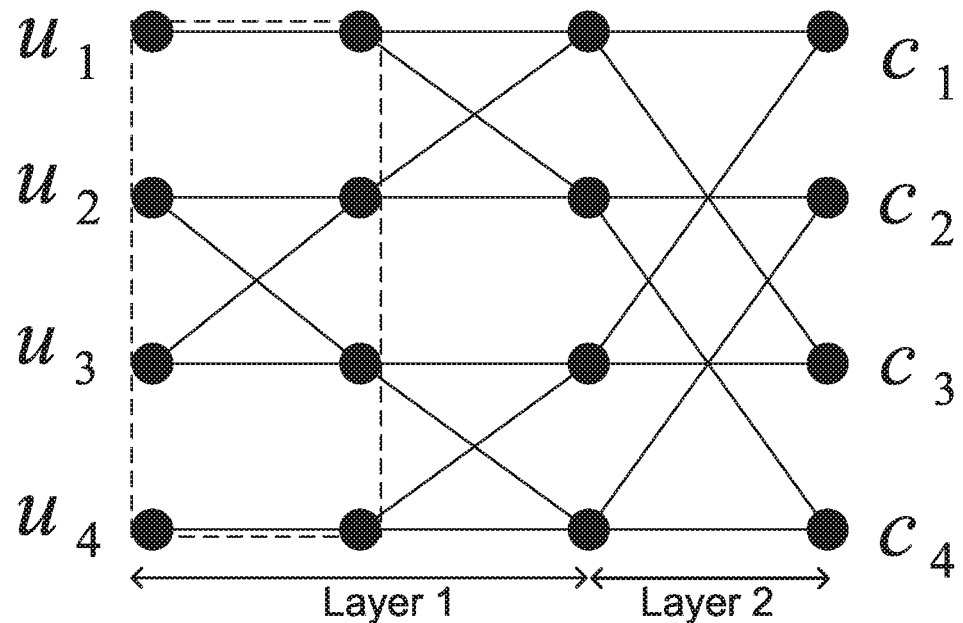
FIGS. 7-11 illustrate example coding graphs of chained polar codes of lengths 4, 8, 16, 32 and 64, respectively.
Figure 8:
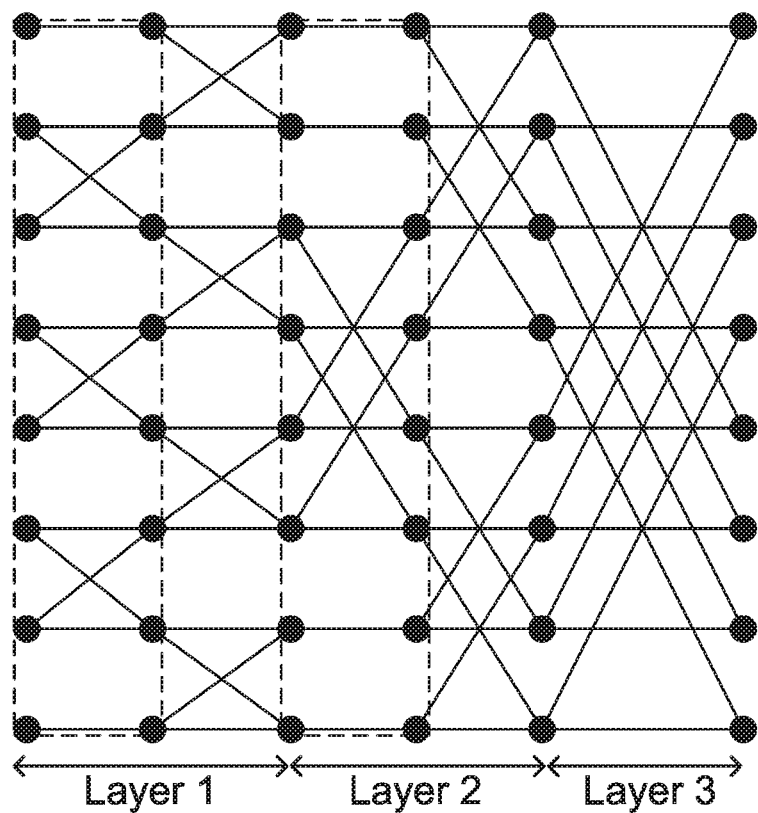
Figure 9:
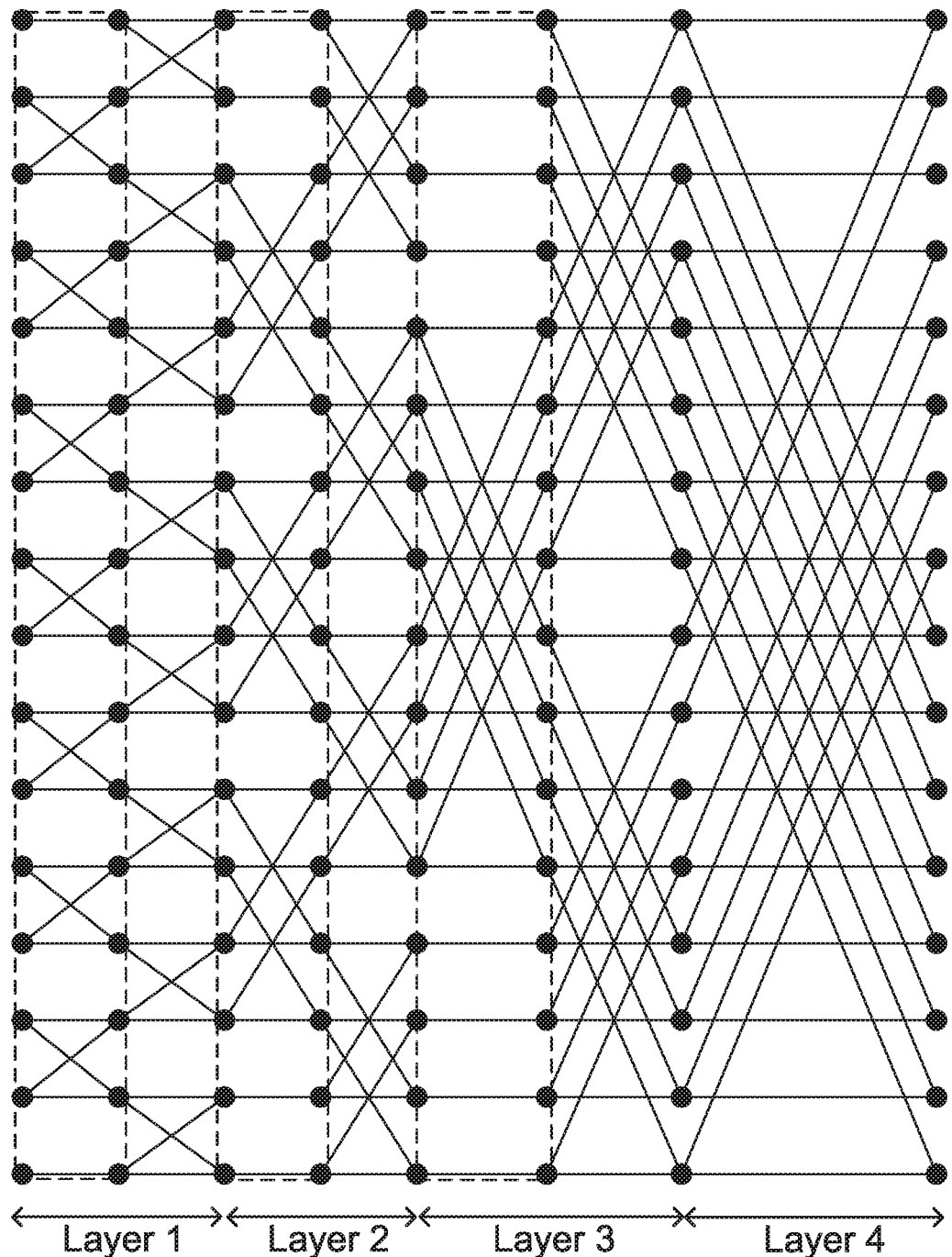
Figure 10:
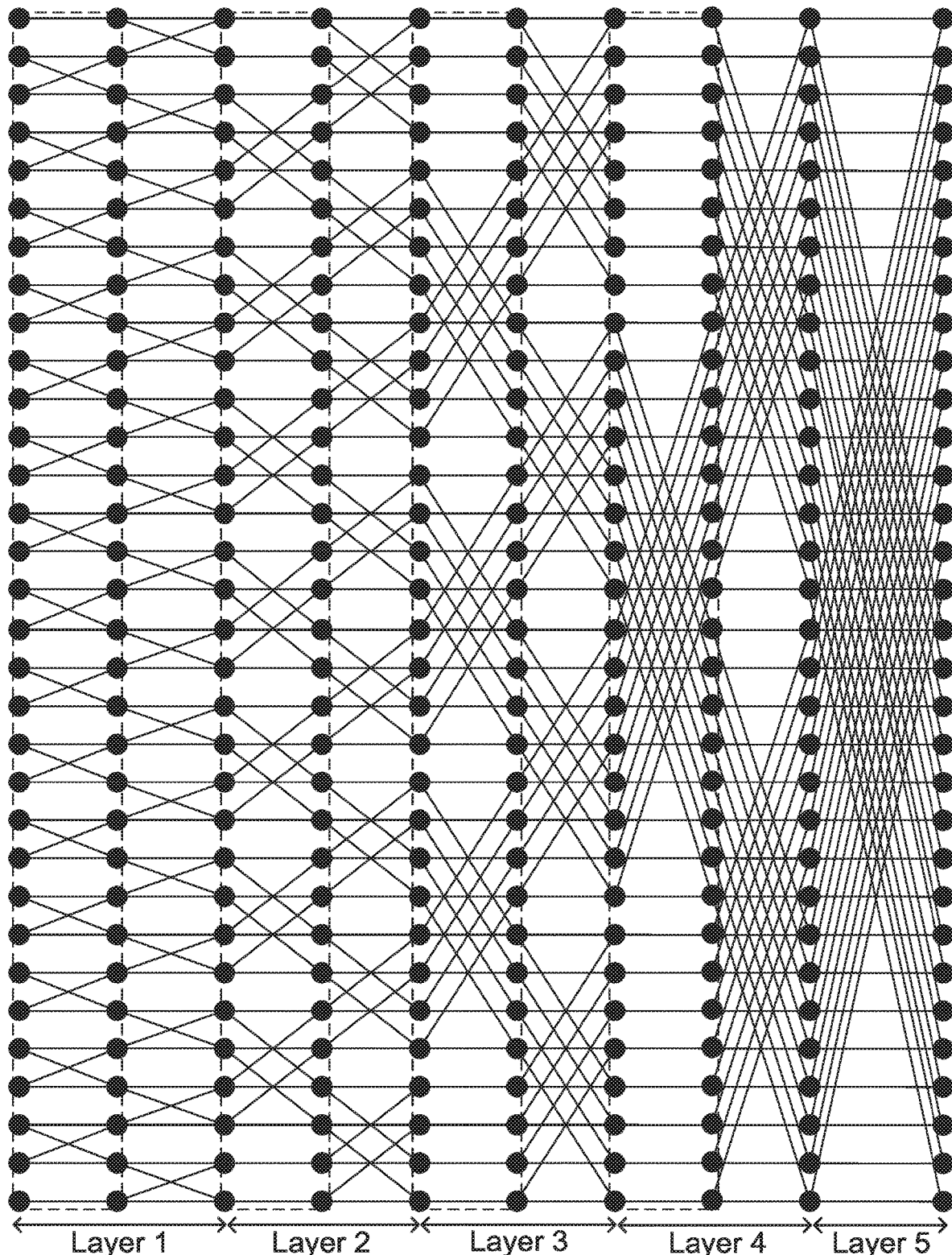
Figure 11:
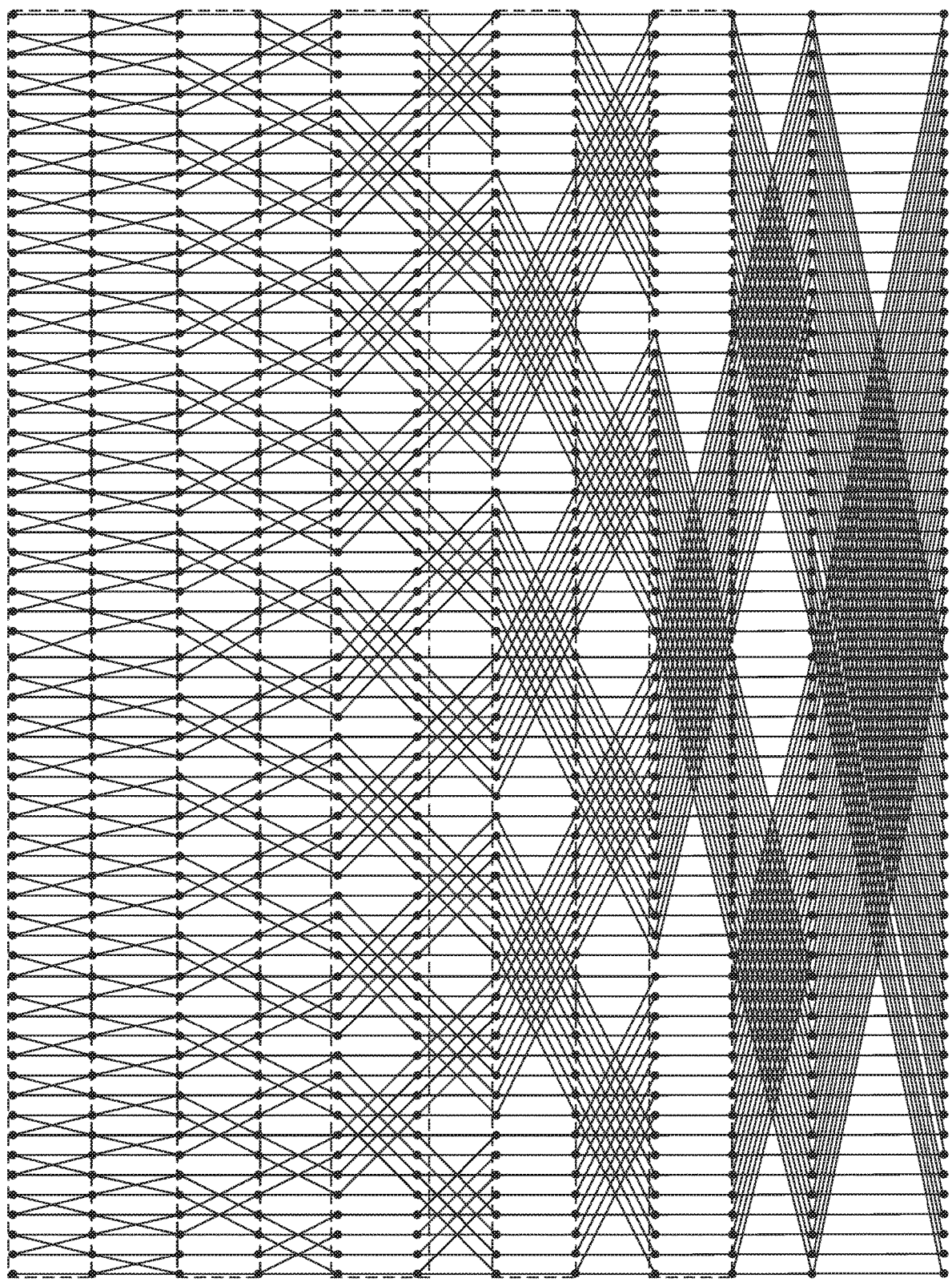

Kernel optimization in chained polar coding could be described in a graphical form by modifying a graph representation of an Arikan polar code to chain so-called "butterfly" shapes representing the 2×2 kernel $$F = \begin{bmatrix} 1 & 0 \\ 1 & 1 \end{bmatrix}$$

to each other. An example graph representation of a butterfly operation corresponding to a 2-by-2 Arikan kernel F is shown in FIG. 6.

A chained polar code encodes an input vector or block $u=[u_1, u_2, \ldots, u_N]$ using n encoding layers or stages, which are numbered from 1 to n in an embodiment. For a 2-by-2 kernel, $n=\log_2 N$, and more generally for a d-by-d kernel $n=\log_d N$. The encoding layers could be obtained, for example, by starting with encoding layers of a polar code and adding butterflies at the inputs of the layers such that they tie together two adjacent butterflies. For layer i, the first $2^{i-1}$ and the last $2^{i-1}$ bits are only copied to the input of the polar encoding layer. This operation is performed for all encoding layers except the last layer.

FIGS. 7-11 illustrate example coding graphs of chained polar codes of lengths 4, 8, 16, 32 and 64, respectively. The parts of these graphs within dashed lines are additional parts which, if removed, will provide graphs of Arikan polar codes.

These graphic representations illustrate that the number of interconnections between bit positions is increased compared to Arikan polar codes, including interconnections between bit positions in the upper half of each graph and those in the lower half of each graph, by layering several sets of interlocked kernels. Polarization is strengthened relative to an Arikan polar code. In fact, the exponent value of a chained polar code is much greater than that of an Arikan polar code, which is ½. Exponent value is indicative of polarization, with a higher exponent value indicating a higher degree of polarization.

Figure 12:
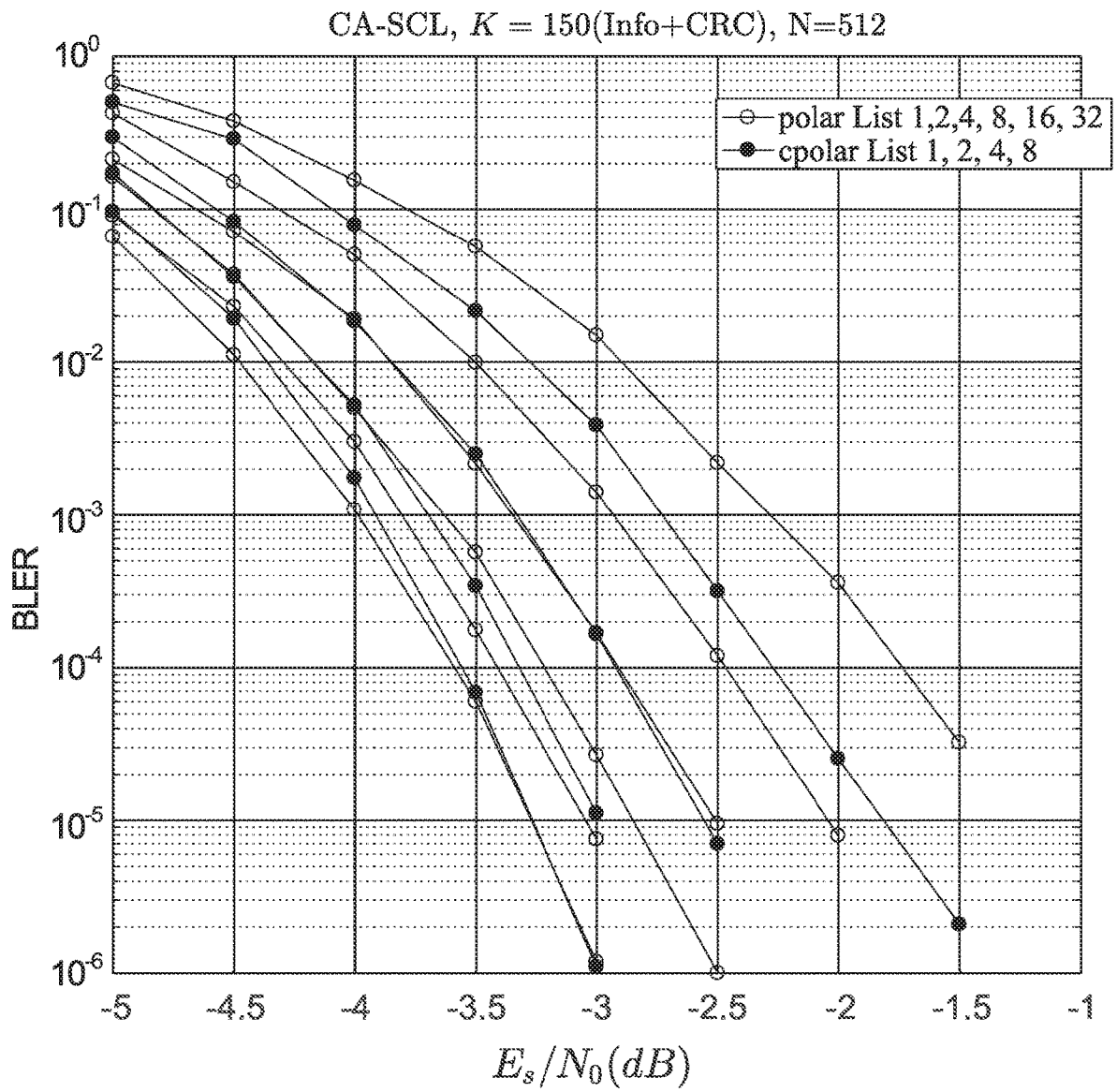
FIG. 12 is a plot of performance results from simulations.

Simulations show significant performance gain versus Arikan polar code for the same list sizes. Chained polar codes could outperform Arikan polar codes across different coding rates under both SC and CA-SCL decoding, for example. FIG. 12 is a plot of performance results from simulations, for Arikan polar codes and chained polar codes (labeled as "cpolar" in FIG. 12). Simulation conditions are listed in FIG. 12. Similar or different results might be observed under different simulation conditions, and/or under similar or different operating conditions.

Arikan polar codes and chained polar codes are both shown to have promising error control performance. The generator matrices $G_N$ of both types of codes could be constructed recursively from generator matrices of smaller length, such as $G_{N/2}$. While recursion is sufficient to describe $G_N$ in terms of $G_{N/2}$ for Arikan polar codes, for chained polar codes additional matrices are introduced to complete the code construction. As can be seen from the graphical representations of chained polar codes in FIGS. 7-11, these additional matrices in general play the role of "chaining" the butterflies in Arikan polar codes together, and therefore can be considered to have a chaining effect.

The present inventors have realized that a unified coding method using chained polar codes, with generator matrices that involve chaining and could also involve recursion, may be expected to have superior performance compared to current coding schemes. In the present disclosure, such a coding method and related embodiments are described.

The generator matrix of an Arikan polar code $G_N=F^{\otimes n}$ can be also written as $$G_N = \begin{bmatrix} G_{N/2} & 0 \\ G_{N/2} & G_{N/2} \end{bmatrix}.$$

The generator matrix of chained polar codes based on a 2-by-2 kernel can be written as $$G_N = \begin{bmatrix} G_{N/2} & 0 \\ (F^{\otimes(n-1)})^T G_{N/2} & G_{N/2} \end{bmatrix},$$

where $G_2=F$. The matrix $(F^{\otimes(n-1)})^T$ is a chaining matrix in this example and introduces the chaining effect to the encoding graph of an Arikan polar code, resulting in the encoding graph of a chained polar code. On the other hand, if this matrix were to be replaced by the identity matrix, then this results in the generator matrix of Arikan polar codes. Numerical analysis has shown that introducing $(F^{\otimes(n-1)})^T$ into the generator matrix of Arikan polar codes increases the distance properties of the code, resulting in improved distance spectra of chained polar codes over Arikan polar codes. Chaining in chained polar codes also results in stronger polarization of the bit-channels.

Figure 13:
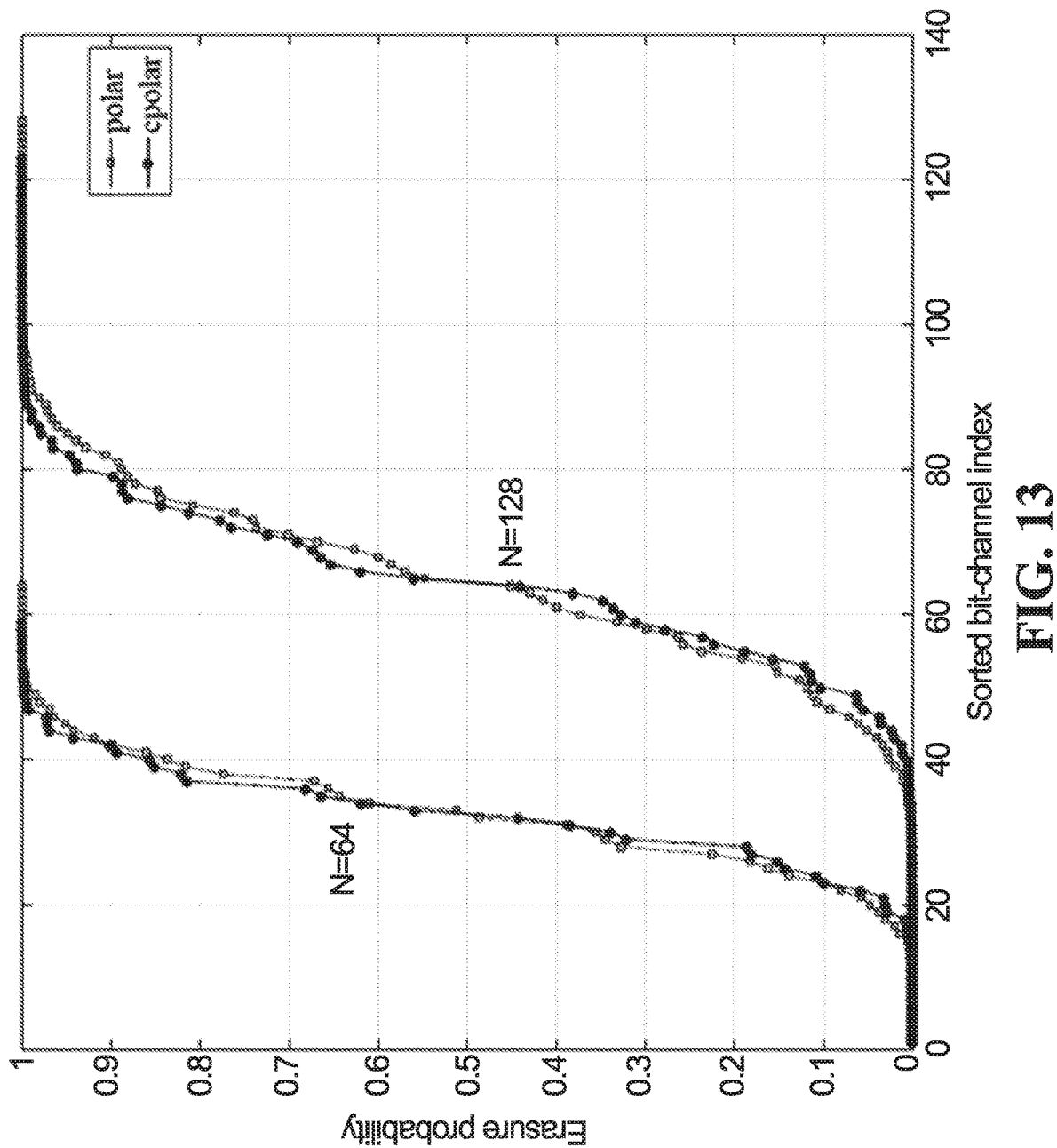
FIG. 13 is another plot of performance results from simulations.

FIG. 13 is another plot of performance results from simulations, and shows erasure probabilities of bit-channels of Arikan polar codes and chained polar codes, labeled as polar and cpolar, respectively, for two code lengths N=64 and N=128. Clearly, in simulation conditions the example chained polar codes show stronger polarization, as "bad" bit-channels in the lower half of the plot become worse for the chained polar codes relative to the Arikan polar codes and the "good" bit channels in the upper half of the plot become better. Similar or different results might be observed under different simulation conditions, and/or under similar or different operating conditions.

The present disclosure relates, in part, to a class of generator matrices, which may be constructed in two steps. A first step is defined based on a polar code construction with a kernel matrix F of size z×z defined over a Galois field GF(q). By this step, a generator matrix of size $z^n$ could be constructed recursively as $$G_N^{(r)} = F \otimes G_{N/z}^{(r)},$$

where $G_z^{(r)}=F$. This matrix is obtained by replacing each nonzero element of F by $G_{N/z}^{(r)}$ and each zero element by an all-zero matrix. Consider the following 3×3 matrix (z=3) as an example:

$$F = \begin{bmatrix} 1 & 0 & 0 \\ 0 & 1 & 0 \\ 1 & 1 & 1 \end{bmatrix}.$$

Then $$G_N^{(r)} = \begin{bmatrix} G_{N/3}^{(r)} & 0 & 0 \\ 0 & G_{N/3}^{(r)} & 0 \\ G_{N/3}^{(r)} & G_{N/3}^{(r)} & G_{N/3}^{(r)} \end{bmatrix}.$$

The generator matrix of a chained polar code with code block length $N=2^n$, can also be written as $$G_N = C_N \begin{bmatrix} G_{N/2} & 0 \\ 0 & G_{N/2} \end{bmatrix} P_N,$$

where $G_2=F$, and $C_N$ and $P_N$ are defined below.

$P_N=[p_{i,j}]$ is a permutation matrix defined as $p_{\pi(j),j}=1$ where $$\pi(j) = \begin{cases} \dfrac{j+1}{2} & j \text{ odd} \\ \dfrac{N+j}{2} & j \text{ even} \end{cases}.$$

Let $R_j$ denote a set of row indices for which $C_N$ is not zero at column j. We then have $R_j=\{2j-1,2j,2j+1\}$ for $j=1 \ldots,$ $$\frac{N}{2}-1, R_{\frac{N}{2}} = \{N-1, N\},$$

$R_j=\{2j-N,2j-N+1\}$ for $$j = \frac{N}{2}+1, \ldots, N-1$$

and $R_N=\{N\}$. The generator matrix $G_N$ can be also described in terms of a graphical structure by modifying that of an Arikan polar code by chaining the butterfly shapes representing the 2×2 kernel $$F = \begin{bmatrix} 1 & 0 \\ 1 & 1 \end{bmatrix}$$

to each other.

Although this step is defined recursively in that a generator matrix of size N is based on a smaller generator matrix, it should be appreciated that recursion does not necessarily involve multiple iterations. For example, the smaller matrix, which is $G_{N/3}^{(r)}$ above, could be stored in memory or otherwise accessible to an encoder, and a larger generator matrix could be constructed in a single iteration.

Another operation that is referred to herein as a chaining step or operation, in which an additional matrix, also referred to herein as a chaining matrix, is applied to a base generator matrix $G_N^{(r)}$ by multiplying certain non-zero entries or elements in the base generator matrix by the chaining matrix, denoted by $C_{N/z}$ herein for ease of reference, and then replacing $G_N^{(r)}$ by $G_N$ in the final formula. For example, a chaining matrix $C_{N/3}$ could be applied to the above base generator matrix $G_N^{(r)}$ by multiplying the first two $G_{N/3}^{(r)}$ entries in the third row of $G_N^{(r)}$ by the chaining matrix $C_{N/3}$, resulting in a generator matrix $$\begin{bmatrix} G_{N/3}^{(r)} & 0 & 0 \\ 0 & G_{N/3}^{(r)} & 0 \\ C_{N/3} G_{N/3}^{(r)} & C_{N/3} G_{N/3}^{(r)} & G_{N/3}^{(r)} \end{bmatrix}.$$

Replacing $G_{N/3}^{(r)}$ in the above formula by $G_{N/3}$ we will have the final generator matrix $$G_N = \begin{bmatrix} G_{N/3} & 0 & 0 \\ 0 & G_{N/3} & 0 \\ C_{N/3}G_{N/3} & C_{N/3}G_{N/3} & G_{N/3} \end{bmatrix}.$$

A chaining matrix is applied to only certain entries in a base generator matrix. Selection of the particular entries to which the chaining matrix is to be applied could be determined, for example, based on target row weights in the final generator matrix. Entry selections could also or instead be determined based on other parameters, and/or using techniques such as numerical analysis.

In general, once the positions in the base generator matrix $G_N^{(r)}$ are selected, the entries $G_{N/Z}^{(r)}$ in those positions are multiplied by the chaining matrix $C_{N/Z}$. Different options for carrying out this type of code construction are presented below.

For a 2×2 kernel $$F = \begin{bmatrix} 1 & 0 \\ 1 & 1 \end{bmatrix},$$

consider a chaining matrix: $C_N = I_N$ for illustrative purposes. With this chaining matrix, a chaining operation constructs the following for an Arikan polar code $$G_N = \begin{bmatrix} G_{N/2} & 0 \\ G_{N/2} & G_{N/2} \end{bmatrix}.$$

With a chaining matrix: $C_N = (F^{\otimes n})^T$ and $N = 2^n$, however, a chaining operation in which the lower left position is selected constructs the following $$G_N = \begin{bmatrix} G_{N/2} & 0 \\ (F^{\otimes(n-1)})^T G_{N/2} & G_{N/2} \end{bmatrix}.$$

For a 4×4 kernel $$F = \begin{bmatrix} 1 & 1 & 1 & 0 \\ \alpha & \alpha^2 & 1 & 0 \\ \alpha^2 & \alpha & 1 & 0 \\ 1 & 1 & 1 & 1 \end{bmatrix}$$

where $\alpha$ is the primitive element of GF(4), and a chaining matrix: $C_N = I_N$ and $N = 4^n$, a chaining operation constructs the following $$G_N = \begin{bmatrix} G_{N/4} & G_{N/4} & G_{N/4} & 0 \\ \alpha G_{N/4} & \alpha^2 G_{N/4} & G_{N/4} & 0 \\ \alpha^2 G_{N/4} & \alpha G_{N/4} & G_{N/4} & 0 \\ G_{N/4} & G_{N/4} & G_{N/4} & G_{N/4} \end{bmatrix}.$$

With a chaining matrix: $C_N = (F^{\otimes n})^T$ and $N = 4^n$, a chaining operation in which positions in the first three columns are selected constructs the following $$G_N = \begin{bmatrix} G_{N/4} & G_{N/4} & G_{N/4} & 0 \\ \alpha G_{N/4} & \alpha^2 G_{N/4} & C_{N/4}G_{N/4} & 0 \\ \alpha^2 G_{N/4} & \alpha G_{N/4}G_{N/4} & G_{N/4} & 0 \\ C_{N/4}G_{N/4} & G_{N/4} & G_{N/4} & G_{N/4} \end{bmatrix}.$$

These are intended to be illustrative examples of constructing generator matrices for chained polar codes. For example, the present disclosure is not limited to applying $C_{N/4}$ only to the positions indicated above. $C_{N/4}$ could also or instead be applied to entries at other positions in other embodiments, such as the entries at positions (row, column)=(4,1), (4,2) and (2,3).

Figure 14:
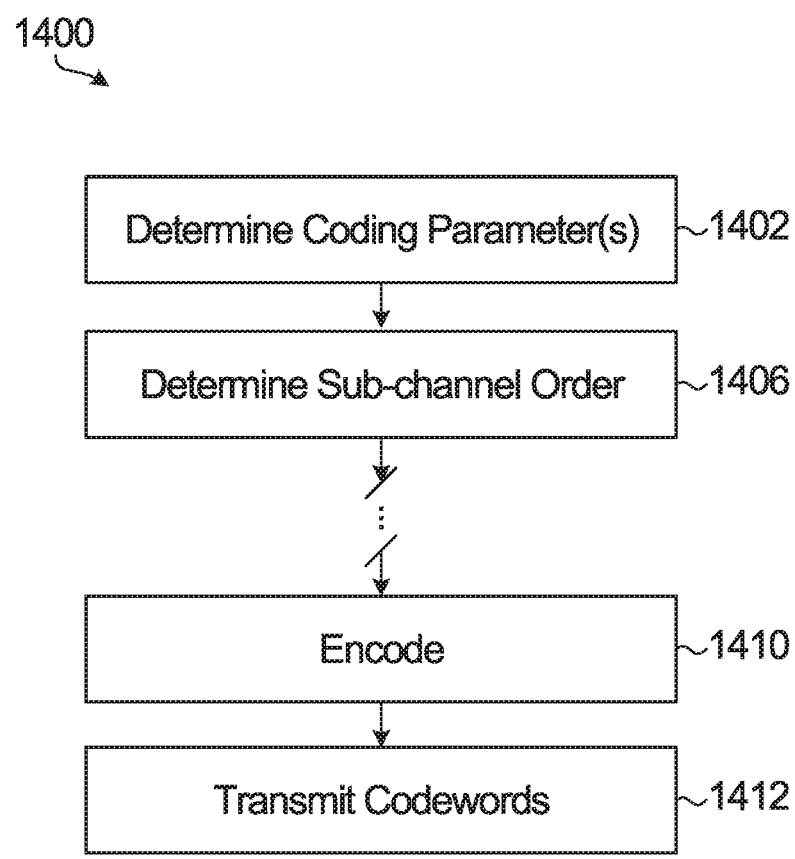
FIG. 14 is a flow diagram of an example coding method according to an embodiment.

FIG. 14 is a flow diagram of an example coding method according to an embodiment. The illustrated example method 1400 includes determining one or more coding parameters at 1402. The coding parameter(s) could include, for example, mother code length N, a number of information bits K, and/or a number of frozen bits. One or more of the coding parameters could be read from memory or otherwise provided. Some parameters, such as code length N, could be computed based on a given K and a given code rate R, for example. At 1406, a reliability order of sub-channels is determined. A rule set could be used to reduce the number of reliability computations and polynomial comparisons that are involved in determining sub-channel order at 1406, for example, which could make it feasible to determine sub-channel order online when information is to be encoded or decoded. One or more reliability orders could be precomputed and stored in memory, and accessed at 1406 when needed for encoding.

An ordered sub-channel sequence as determined at 1406 could be used to select information sub-channels, frozen sub-channels, and/or other types of sub-channels when information is to be encoded at 1410. The encoding at 1410 is based on a chained generator matrix. Codewords are then transmitted at 1412.

The encoding at 1410 based on a chained generator matrix produces codewords that each correspond to the product of an input vector and the chained generator matrix. The input vector could include information bits (including decoding-assistant bits) and frozen bits. This is shown by way of example for an Arikan polar code in FIGS. 2 and 3. Matrix-based encoding in the case of a chained polar code is similar in that a codeword corresponds to the product of an input vector and a generator matrix, but the generator matrix for a chained polar code is different from the generator matrix for an Arikan polar code. An encoder for a chained polar code would have some encoder interconnections that are different from those shown in FIG. 3, and an encoding graph that is different from the encoding graph for an Arikan polar code.

The example method in FIG. 14 is intended for illustrative purposes. Other embodiments could involve performing the illustrated operations in any of various ways, performing fewer or additional operations, and/or varying the order in which operations are performed.

Figure 15:
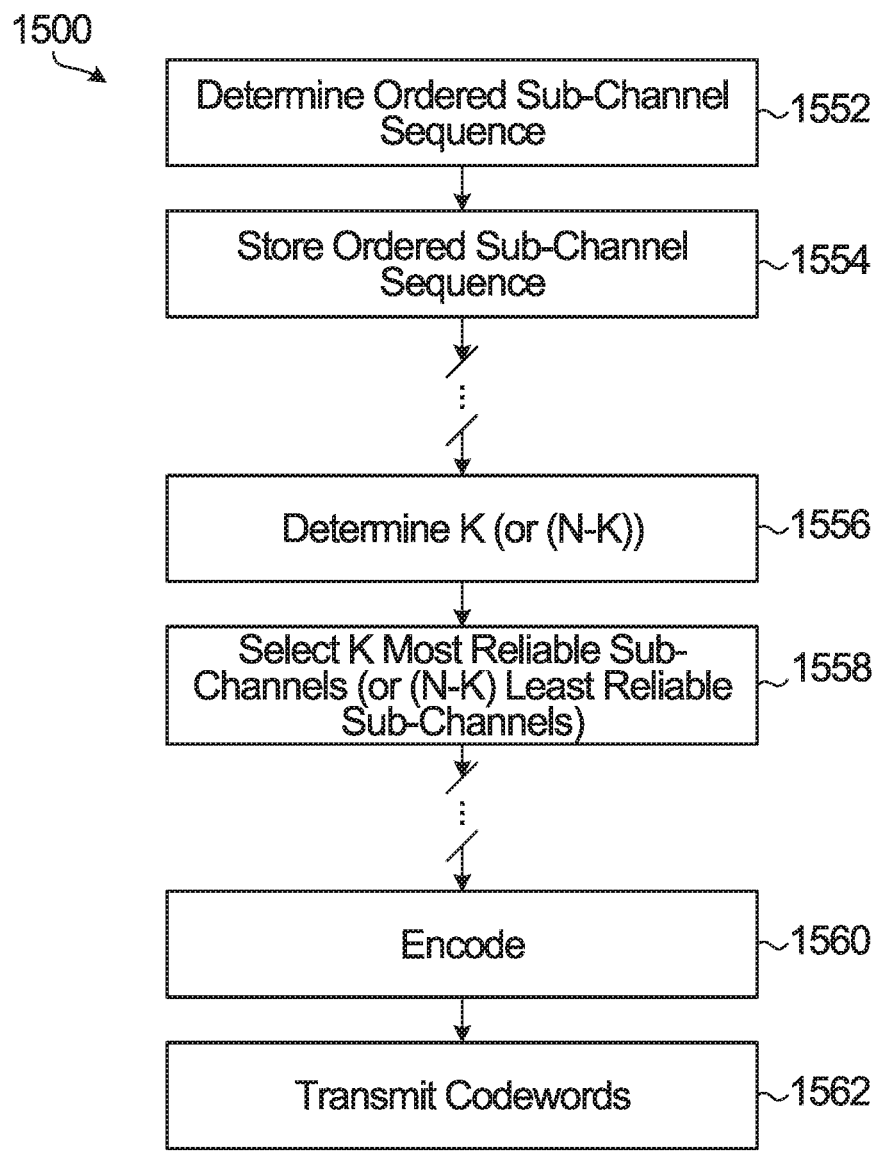
FIG. 15 is a flow diagram of an example coding method according to a further embodiment.

FIG. 15 is a flow diagram of an example of such a coding method 1500 according to a further embodiment. The example method 1500 involves determining an ordered sequence of sub-channels at 1552 and storing the determined ordered sub-channel sequence at 1554. In some implementations, these steps may be optional and/or performed in advance, separately from other coding operations in coding method 1500. For example, the coding method 1500 may instead simply include determining an ordered sub-channel sequence at 1552 by retrieving or reading the stored the ordered sub-channel sequence from memory. Other possibilities exist.

One or more coding parameters, which could include K or (N−K) depending on the type of sub-channels to be selected, are determined at 1556, and examples of operations that could be involved in determining K or (N−K) are described herein. At 1558, K most reliable sub-channels, or (N−K) least reliable sub-channels, of the N sub-channels are selected. The encoding at 1560 involves encoding input bits onto the K most reliable sub-channels, according to the selection at 1558 and a chained generator matrix. Encoding based on a chained generator matrix is described above with reference to FIG. 14. Codewords that are generated by the encoding at 1560 are transmitted at 1562.

The example method 1500 is intended for illustrative purposes. Other embodiments could involve performing the illustrated operations in any of various ways, performing fewer or additional operations, and/or varying the order in which operations are performed. Other variations could be or become apparent to a skilled person based on the present disclosure.

Figure 16A:
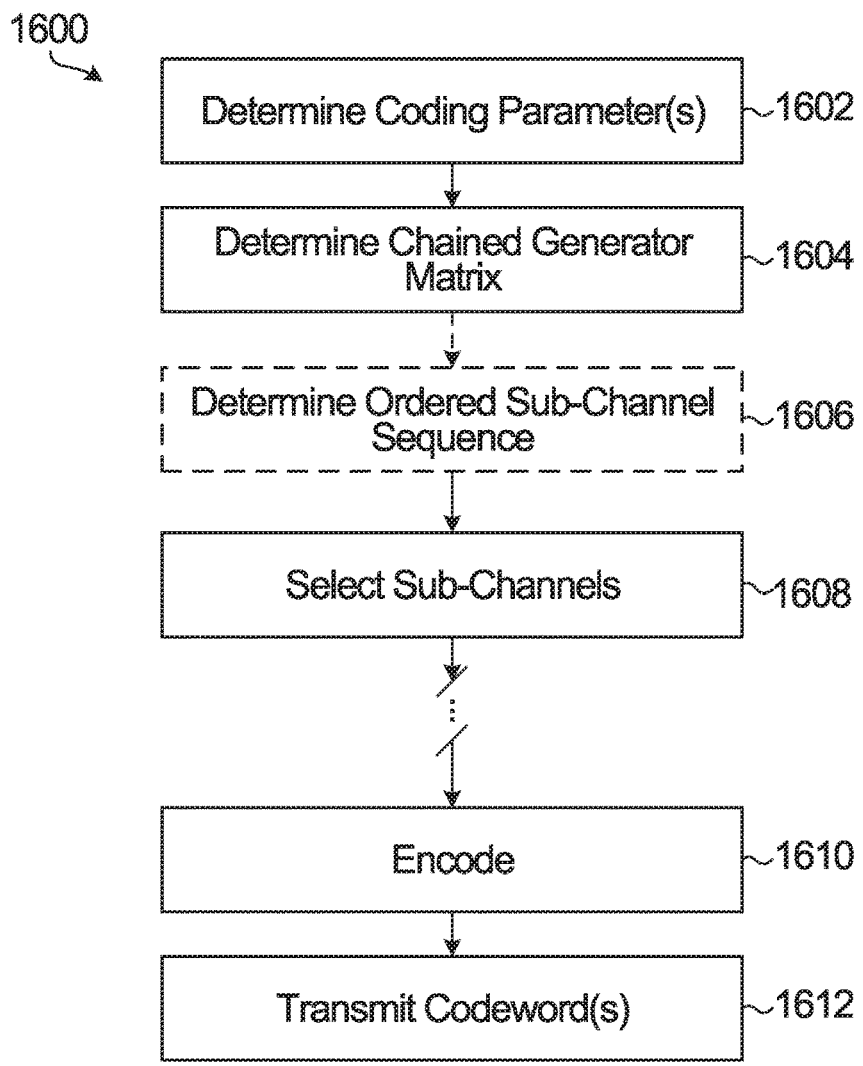
FIG. 16A is a flow diagram of an example coding method according to yet another embodiment.

FIGS. 14 and 15 illustrate general examples of coding methods. FIG. 16A is a flow diagram of an example coding method according to yet another embodiment.

The example method 1600 includes determining one or more coding parameters at 1602, such as N and/or K. Coding parameters could be read from memory, computed, or otherwise provided. A chained generator matrix is determined at 1604, by constructing the matrix as disclosed herein, for example. At 1606, an ordered sequence representing a reliability order of sub-channels is determined. Either or both of the operations at 1604 and 1606 could be performed when information is to be encoded or decoded, or performed in advance. Chained generator matrices and/or ordered sub-channel sequences for different coding parameters could be pre-computed and stored in memory, and accessed at when needed for encoding, for example.

An ordered sub-channel sequence as determined at 1606 could be used at 1608 in selecting information sub-channels, frozen sub-channels, and/or other types of sub-channels. Input bits are encoded at 1610 based on a chained generator matrix, to generate a codeword. The codeword may then be transmitted at 1612. Multiple codewords could be generated and transmitted at 1610, 1612.

Figure 16B:
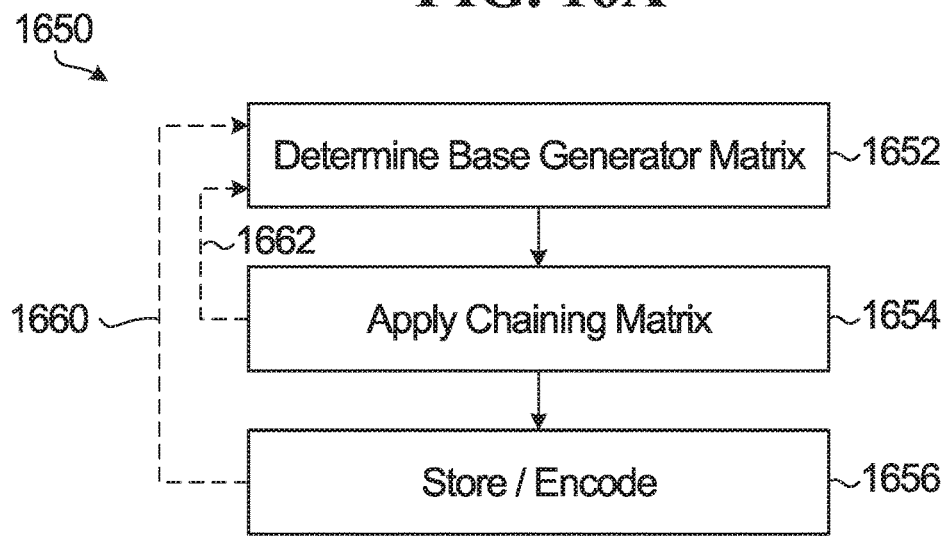
FIG. 16B is a flow diagram of an example method for constructing a chained generator matrix.

As noted above, the generator matrix could be determined at 1604 by constructing the matrix. FIG. 16B is a flow diagram of an example method 1650 for constructing a chained generator matrix. At 1652, a base generator matrix is determined. The base generator matrix could be a kernel or a higher-dimension matrix, and could be read from memory or otherwise determined at 1652.

A chaining matrix is applied at 1654, to some but not all positions or entries in the base generator matrix, resulting in a chained generator matrix. The chained generator matrix could be stored to memory or used for encoding at 1656.

Construction of a chained generator matrix could be iterative. The base generator matrix that is determined at 1652 for one iteration could itself have been constructed in a preceding iteration. In iterative chained generator matrix construction, the chained generator matrix from each iteration could be stored at 1656 and then used to construct the base generator matrix in a next iteration as represented at 1660, or only a final chained generator matrix for a code of at least a target length could be stored and/or used for encoding at 1656, after multiple iterations as represented at 1662.

The example methods 1600, 1650, like the other example methods 1400, 1500 in FIGS. 14 and 15, are intended for illustrative purposes. Other embodiments could involve performing the illustrated operations in any of various ways, performing fewer or additional operations, and/or varying the order in which operations are performed. Other variations could be or become apparent to a skilled person based on the present disclosure.

For example, the present disclosure encompasses a method that involves, for constructing a chained generator matrix: applying, to a subset of entries in a base generator matrix for a chained polar code, a chaining matrix to construct a chained generator matrix that is different from the base generator matrix. In an embodiment, the chained generator matrix is stored to a memory for use in encoding input bits. A method could also involve encoding the input bits according to the chained generator matrix to generate a codeword, and transmitting the codeword.

According to another embodiment, a method for generating and transmitting a codeword involves encoding input bits according to a chained generator matrix to generate a codeword, and transmitting the codeword. The chained generator matrix includes a first subset of entries from a base generator matrix for a chained polar code, and a second subset of entries that are different from entries in the base generator matrix. The chained generator matrix could be constructed when the input bits are encoded, or determined in some other way, by reading from memory for example. Construction of the chained generator matrix could involve applying a chaining matrix to the second subset of entries in the base generator matrix, to produce the second subset of entries in the chained generator matrix.

Any one or more of the following could be provided, alone or in any of various combinations, in embodiments:

the base generator matrix is based on a z-by-z kernel, the entries in the base generator matrix comprise N/z-by-N/z matrices, and wherein the chained generator matrix is an N-by-N matrix;

$z=2$, $N=2^n$, and the chaining matrix is $(F^{\otimes(n-1)})^T$, where F is the kernel;

selecting the subset of the entries in the base generator matrix that are different from those in the chained generator matrix (e.g., the second subset) based on a target row weight for the chained generator matrix;

the base generator matrix is based on a generator matrix that is smaller than the base generator matrix;

constructing the base generator matrix based on a generator matrix that is smaller than the base generator matrix;

constructing a further generator matrix based on the chained generator matrix;

applying, to a subset of entries in the further generator matrix, a chaining matrix to construct a further chained generator matrix that is different from the further generator matrix;

in each of a plurality of iterations until a chained generator matrix of at least a target size is reached: constructing a further generator matrix based on a kernel and a chained generator matrix from a previous iteration; applying, to a subset of entries in the further generator matrix, a chaining matrix to construct a further chained generator matrix that is different from the further generator matrix;

storing to a memory the chained generator matrix from a final iteration;

storing to the memory the chained generator matrix from each iteration before the final iteration;

non-zero entries in the base generator matrix comprise a common matrix;

the encoding involves: applying to the common matrix respective parts of an input vector that includes the input bits, and applying each of a subset of the respective parts of the input vector to a chaining matrix and the common matrix, as described in further detail below by way of example, with reference to FIG. 17;

switching the common matrix and the chaining matrix between: a non-chained polar code matrix as the common matrix and an identity matrix as the chaining matrix, for Arikan polar coding; and a chained polar code matrix as the common matrix and a non-identity matrix as the chaining matrix, for chained polar coding—this is also described below by way of example with reference to FIG. 17.

Although FIGS. 14, 15, 16A, and 16B show example operations that would be performed at an encoder (or transmitter), other embodiments could be implemented at a decoder (or receiver). A word that is based on a codeword of a code could be received at a receiver and decoded, based on a chained generator matrix and sub-channels that are selected by the decoder, a sub-channel selector coupled to the decoder, or a processor in a processor-based embodiment, according to a method as shown in any of FIGS. 14, 15, 16A, and 16B, and/or as otherwise disclosed herein.

In another embodiment, a non-transitory processor-readable medium stores instructions which, when executed by one or more processors, cause the one or more processors to perform a method as disclosed herein.

Figure 17:
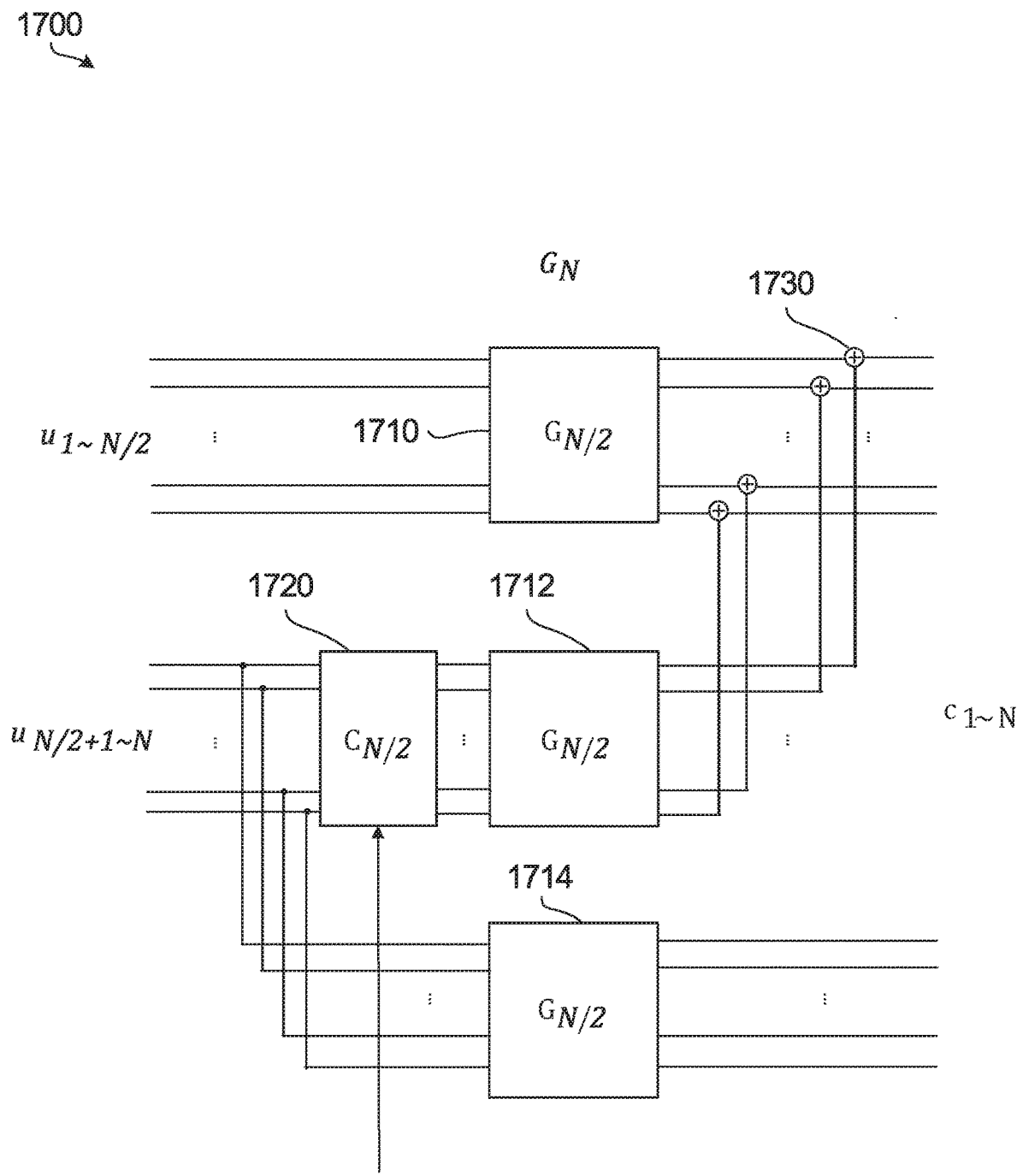
FIG. 17 is a block diagram of an example encoding apparatus according to a still further embodiment.

FIG. 17 is a block diagram of an example encoding apparatus according to a still further embodiment. The encoding apparatus 1700 encodes an information block using recursion and a chaining matrix, for an embodiment that is based on a 2×2 kernel.

In this example, the encoding apparatus 1700 includes component encoders 1710, 1712, 1714, a multiplier 1720, and exclusive OR (XOR) elements, one of which is labeled at 1730. The component encoders 1710, 1712, 1714 and the multiplier 1720 could be implemented, for example, as matrix multipliers. XOR gates or adders could be used to implement the XOR elements 1730. One or more processors or other elements that execute software stored in a memory (not shown) could be used to implement any or all of the elements shown in FIG. 17.

The encoding apparatus 1700 implements a code length of N, and each of the component encoders 1710, 1712, 1714 implements encoding based on a generator matrix of length N/2 in this example for a 2×2 kernel. The component encoder 1710 receives the first N/2 input bits $u_{1 \sim N/2}$, and both the multiplier 1720 and the component encoder 1714 receive the remaining N/2 input bits $u_{N/2+1 \sim N}$. The component encoder 1712 receives N/2 output bits from the multiplier 1720, which is controllable to apply, to $u_{N/2+1 \sim N}$, one of the following as a chaining matrix:

$$C_{N/2} = \begin{cases} I_{N/2} \\ (F^{\otimes(n-1)})^T \end{cases}$$

With the identity matrix applied by the multiplier 1720 and an Arikan generator matrix applied by the component encoders 1710, 1712, 1714, the encoding apparatus 1700 implements an Arikan polar code. With a non-identity chaining matrix and a chained generator matrix applied by the component encoders 1710, 1712, 1714, the encoding apparatus 1700 implements a chained polar code. Switching between Arikan and chained polar coding could involve, for example, supplying different chaining matrices (identity for Arikan polar coding and non-identity for chained polar coding) to the multiplier 1720 and supplying different generator matrices (Arikan or chained) to the component encoders 1710, 1712, 1714. The multiplier 1720 and/or the component encoders 1710, 1712, 1714 could also or instead be controlled to obtain different matrices from a memory or to otherwise obtain different matrices. In another embodiment, the multiplier 1720 is configured to apply a chaining matrix, and the chaining matrix could be either applied for chained polar codes or not applied for Arikan codes by controlling input path switching, to have input bits either processed or not processed by the multiplier.

In FIG. 17, encoding is performed by dividing an input vector or information block into two parts or sub-blocks of length N/2. The chaining matrix $C_{N/2}$ is only applied to the second sub-block. Different codes could be constructed by selecting the chaining matrix from a certain number of different chaining matrices, which could be stored in a memory, for example.

More generally, generator matrix construction could be implemented with a z×z kernel and a code length of $N=z^n$. In this case, an input information block is divided into z sub-blocks and encoded according the generator matrix of size $$\frac{N}{z} \times \frac{N}{z}$$

with possible application of a chaining matrix. FIG. 17 is a 2×2 example of this. An encoding apparatus of the type shown in FIG. 17 could be adapted for other sizes of kernels and/or provide a reconfigurable encoding apparatus that can be switched between Arikan polar and chained polar codes.

A controller, implemented using hardware or circuitry that could be configured by executing software, for example, could be coupled to the component encoders 1710, 1712, 1714 and to the controller 1720, to control matrix switching and/or input path switching, for example.

Figure 18:
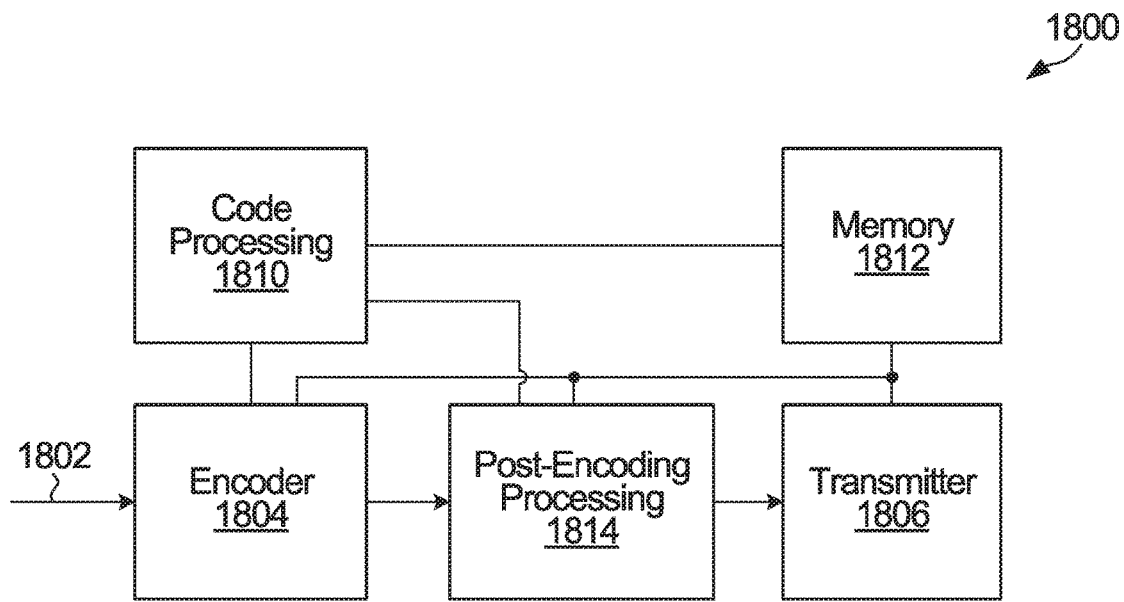
FIG. 18 is a block diagram of an example apparatus for encoding and transmitting codewords.

FIG. 18 is a block diagram of an example apparatus for encoding and transmitting codewords. The apparatus 1800 includes an encoder module 1804 coupled to a transmitter module 1806. The apparatus 1800 also includes a code processing module 1810 coupled to the encoder module 1804 and a post-encoding processing module 1814. The post-encoding processing module 1814 is also coupled to the encoder module 1804 and to the transmitter module 1806. A memory 1812, also shown in FIG. 18, is coupled to the encoder module 1804, to the code processing module 1810, to the post-encoding processing module 1814, and to the transmitter module 1806. Although not shown, the transmitter module 1806 could include a modulator, an amplifier, antenna and/or other modules or components of a transmit chain or alternatively could be configured to interface with a separate (Radio-Frequency, RF) transmission module. For example, some of all of the modules 1804, 1806, 1810, 1812, 1814 of the apparatus 1800 may be implemented in hardware or circuitry (e.g. in one or more chipsets, microprocessors, Application-Specific Integrated Circuits (ASICs), Field-Programmable Gate Arrays (FPGAs), dedicated logic circuitry, or combinations thereof) so as to produce codewords as described herein for transmission by a separate (RF) unit.

In some embodiments, the memory 1812 is a non-transitory computer readable medium, that includes instructions for execution by a processor to implement and/or control operation of the code processing module 1810, the encoder module 1804, the post-encoding processing module 1814, and the transmitter module 1806 in FIG. 18, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a compact disc read-only memory (CD-ROM), universal serial bus (USB) flash disk, or a removable hard disk, at 1812.

In some embodiments, the encoder module 1804 is implemented in circuitry, such as a processor, that is configured to encode input bits as disclosed herein. FIG. 17 is one example of an encoder module. In a processor-based implementation of the encoder module 1804, processor-executable instructions to configure a processor to perform encoding operations are stored in a non-transitory processor-readable medium. The non-transitory medium could include, in the memory 1812 for example, one or more solid-state memory devices and/or memory devices with movable and possibly removable storage media.

The code processing module 1810 could be implemented in circuitry that is configured to determine coding parameters such as mother code block length, and to determine an ordered sub-channel sequence as disclosed herein. The code processing module 1810 circuitry could also or instead be configured for chained generator matrix construction. In some embodiments, the code processing module 1810 is implemented using a processor. The same processor or other circuitry, or separate processors or circuitry, could be used to implement both the encoder module 1804 and the code processing module 1810. As noted above for the encoder module 1804, in a processor-based implementation of the code processing module 1810, processor-executable instructions to configure a processor to perform code processing operations are stored in a non-transitory processor-readable medium, in the memory 1812 for example.

Like the encoder module 1804 and the code processing module 1810, the post-encoding processing module 1814 is implemented in circuitry, such as a processor, that is configured to perform various post-encoding operations. These post-encoding operations could include rate-matching operations such as puncturing, shortening and/or interleaving, for example. In a processor-based implementation of the post-encoding processing module 1814, processor-executable instructions to configure a processor to perform post-encoding operations are stored in a non-transitory processor-readable medium, examples of which are described above. In an embodiment, the post-encoding processing module 1814 derives a puncturing or shortening scheme from a puncturing or shortening scheme that is to be applied to a codeword prior to transmission. Information indicative of bit positions and/or sub-channels that are affected by post-encoding operations, or information from which such bit positions or sub-channels may be determined, may be fed back to the code processing module 1810, stored to the memory 1812, or otherwise made available to the code processing module 1810 by the post-encoding processing module 1814.

In some embodiments of the code processing module 1810, the coding parameters and/or the ordered sub-channel sequence may be determined based on information from the post-encoding processing module 1814. For instance, the ordered sub-channel sequence may be determined based on the rate-matching scheme determined by the post-encoding processing module 1814. Conversely, in some other embodiments, the post-encoding processing module 1814 may determine a rate-matching scheme based on the coding parameters and/or the ordered sub-channel sequence determined by the code processing module 1810. In yet some other embodiments, the determinations made within the code processing module 1810 and post-encoding processing module 1814 are jointly performed and optimized.

The encoder module 1804 is configured to receive input bits at 1802, and encode those input bits into codewords based on a chained generator matrix. The transmitter module 1806 is coupled to the encoder module 1804, through the post-encoding processing module 1814 in the example shown, to transmit the codeword.

The encoder module 1804, other components of the example apparatus 1800, and/or a processor in a processor-based embodiment, could implement any of various other features that are disclosed herein. For example, in an embodiment, an apparatus includes an encoder to construct a chained generator matrix. Such an encoder, a processor in a processor-based embodiment, or another component could be configured to apply, to a subset of entries in a base generator matrix for a chained polar code, a chaining matrix to construct a chained generator matrix that is different from the base generator matrix. In an embodiment, the chained generator matrix is stored to a memory for use in encoding input bits. An encoder is configured to encode the input bits according to the chained generator matrix to generate a codeword. The codeword could be transmitted by a transmitter that is coupled to the encoder.

According to another embodiment, an apparatus for generating and transmitting a codeword includes an encoder to encode input bits according to a chained generator matrix to generate a codeword, and a transmitter, coupled to the encoder, to transmit the codeword. The chained generator matrix includes a first subset of entries from a base generator matrix for a chained polar code, and a second subset of entries that are different from entries in the base generator matrix. The chained generator matrix could be constructed when the input bits are encoded, or determined in some other way, by reading from memory for example. The encoder or another component could be configured to apply a chaining matrix to the second subset of entries in the base generator matrix, to produce the second subset of entries in the chained generator matrix.

Any one or more of the following could be provided, alone or in any of various combinations, in embodiments:

the base generator matrix is based on a z-by-z kernel, the entries in the base generator matrix comprise N/z-by-N/z matrices, and wherein the chained generator matrix is an N-by-N matrix;

$z=2$, $N=2^n$, and the chaining matrix is $(F^{\otimes(n-1)})^T$, where F is the kernel;

an encoder, a processor in a processor-based embodiment, or another component, is configured to select the subset of the entries in the base generator matrix that are different from those in the chained generator matrix (e.g., the second subset) based on a target row weight for the chained generator matrix;

the base generator matrix is based on a generator matrix that is smaller than the base generator matrix;

an encoder, a processor in a processor-based embodiment, or another component, is configured to construct the base generator matrix based on a generator matrix that is smaller than the base generator matrix;

an encoder, a processor in a processor-based embodiment, or another component, is configured to construct a further generator matrix based on the chained generator matrix;

an encoder, a processor in a processor-based embodiment, or another component, is configured to apply, to a subset of entries in the further generator matrix, a chaining matrix to construct a further chained generator matrix that is different from the further generator matrix;

an encoder, a processor in a processor-based embodiment, or another component, is configured to, in each of a plurality of iterations until a chained generator matrix of at least a target size is reached: construct a further generator matrix based on a kernel and a chained generator matrix from a previous iteration; and apply, to a subset of entries in the further generator matrix, a chaining matrix to construct a further chained generator matrix that is different from the further generator matrix;

a memory, coupled to an encoder, a processor in a processor-based embodiment, or another component;

an encoder, a processor in a processor-based embodiment, or another component, is configured to store to the memory the chained generator matrix from a final iteration;

an encoder, a processor in a processor-based embodiment, or another component, is configured to store to the memory the chained generator matrix from each iteration before the final iteration;

non-zero entries in the base generator matrix comprise a common matrix;

an encoder, a processor in a processor-based embodiment, or another component, is configured to apply to the common matrix respective parts of an input vector that includes the input bits, and apply each of a subset of the respective parts of the input vector to a chaining matrix and the common matrix, as described by way of example above with reference to FIG. 17;

an encoder, a processor in a processor-based embodiment, or another component, is configured to switch the common matrix and the chaining matrix between: a non-chained polar code matrix as the common matrix and an identity matrix as the chaining matrix, for Arikan polar coding; and a chained polar code matrix as the common matrix and a non-identity matrix as the chaining matrix, for chained polar coding—this is also described by way of example above with reference to FIG. 17;

as described above, in an embodiment consistent with the example shown in FIG. 17, an encoder is implemented using respective matrix multipliers (e.g., as the component encoders 1710, 1714 and the multiplier 1720) to apply the respective parts of the input vector to the common matrix (e.g., at 1710, 1714), and to apply each of the subset of the respective parts of the input vector to the chaining matrix (e.g., at 1720) and the common matrix (e.g., at 1712);

a controller, coupled to the matrix multipliers, to switch the common matrix and the chaining matrix between: a non-chained polar code matrix as the common matrix and an identity matrix as the chaining matrix; and a chained polar code matrix as the common matrix and a non-identity matrix as the chaining matrix;

a controller, coupled to the matrix multipliers, to switch the common matrix between a chained polar code matrix and a non-chained polar code matrix, and to switch each of the subset of the respective parts of the input vector either: to a respective one of the multipliers to apply the chaining matrix when the common matrix is switched to a chained polar code matrix; or to bypass the respective one of the multipliers to bypass applying the chaining matrix to the input bits when the common matrix is switched to a non-chained polar code matrix. The input vector switching is also described by way of example above as input path switching.

The apparatus 1800 could implement any of various other features that are disclosed herein. For example, the encoder module 1804, the transmitter module 1806, the code processing module 1810, the post-encoding processing module 1814, and/or a processor in a processor-based embodiment, could be configured to implement any one or more of the features listed or otherwise described herein.

In some alternative embodiments, the functionality of the encoder module 1804, the transmitter module 1806, the code processing module 1810, and/or the post-encoding processing module 1814 described herein may be fully or partially implemented in hardware or alternatively in software, for example in modules stored in a memory such as 1812 and executed by one or more processors of the apparatus 1800.

An apparatus could therefore include a processor, and a memory such as 1812, coupled to the processor, storing instructions which, when executed by the processor, cause the processor to perform the functionality and/or embodiments described above in relation to the encoder module 1804, the transmitter module 1806, the code processing module 1810, and/or the post-encoding module 1814 described herein.

Figure 19:
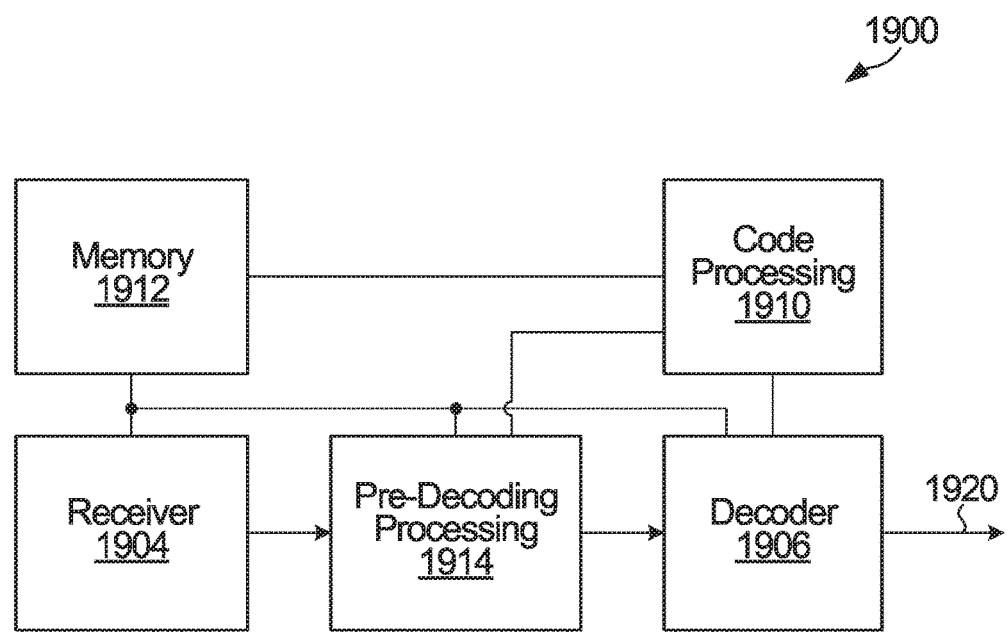
FIG. 19 is a block diagram of an example apparatus for receiving and decoding codewords.

FIG. 19 is a block diagram of an example apparatus for receiving and decoding codewords. The apparatus 1900 includes a receiver module 1904 which is configured to receive signals transmitted wirelessly and which is coupled to a decoder module 1906. The apparatus 1900 also includes a code processing module 1910 coupled to the decoder module 1906 and a pre-decoding processing module 1914. The pre-decoding processing module 1914 is also coupled to the decoder module 1906 and to the receiver module 1904. A memory 1912 also shown in FIG. 19, is coupled to the decoder module 1906, to the code processing module 1910, to the receiver module 1904, and to the pre-decoding processing module 1914.

Although not shown, the receiver module 1904 could include an antenna, demodulator, amplifier, and/or other modules or components of a receive chain or alternatively could be configured to interface with a separate (RF) receiving module. For example, some of all of the modules 1904, 1906, 1910, 1912, 1914 of the apparatus 1900 may be implemented in hardware or circuitry (e.g. in one or more chipsets, microprocessors, ASICs, FPGAs, dedicated logic circuitry, or combinations thereof) so as to receive a word based on a codeword of a chained polar code as described herein. Decoded bits are output at 1920 for further receiver processing.

In some embodiments, the memory 1912 is a non-transitory computer readable medium that includes instructions for execution by a processor to implement and/or control operation of the receiver module 1904, decoder module 1906, the code processing module 1910, and the pre-decoding processing module 1914 in FIG. 19, and/or to otherwise control the execution of functionality and/or embodiments described herein. In some embodiments, the processor may be a component of a general-purpose computer hardware platform. In other embodiments, the processor may be a component of a special-purpose hardware platform. For example, the processor may be an embedded processor, and the instructions may be provided as firmware. Some embodiments may be implemented by using hardware only. In some embodiments, the instructions for execution by a processor may be embodied in the form of a software product. The software product may be stored in a non-volatile or non-transitory storage medium, which could be, for example, a CD-ROM, USB flash disk, or a removable hard disk, at 1912.

The decoder module 1906 is implemented in circuitry, such as a processor, that is configured to decode received codewords as disclosed herein. In a processor-based implementation of the decoder module 1906, processor-executable instructions to configure a processor to perform decoding operations are stored in a non-transitory processor-readable medium. The non-transitory medium could include, in the memory 1912 for example, one or more solid-state memory devices and/or memory devices with movable and possibly removable storage media.

The code processing module 1910 could be implemented in circuitry that is configured to determine (and store to the memory 1912) ordered sub-channel sequences. Such circuitry could also or instead be configured to construct chained generator matrices as disclosed herein, and to store constructed generator matrices to the memory 1912 or otherwise provide them to the decoder 1904. In a processor-based implementation of the code-processing module 1910, processor-executable instructions to configure a processor to perform code-processing operations are stored in a non-transitory processor-readable medium, examples of which are described above. Information representing ordered sub-channel sequences, and/or the selected sub-channels could be provided to the decoder module 1906 by the code processing module 1910 for use in decoding received words, and/or stored in the memory 1912 by the code processing module 1910 for subsequent use by the decoder module 1906.

Like the decoder module 1906 and the code processing module 1910, the pre-decoding processing module 1914 is implemented in circuitry, such as a processor, that is configured to perform pre-decoding operations. These operations could include receiver/decoder-side rate matching operations also known as de-rate-matching operations, such as de-puncturing and/or de-shortening to reverse puncturing/shortening that was applied at an encoder/transmitter side, for example. In a processor-based implementation of the pre-decoding processing module 1914, processor-executable instructions to configure a processor to perform pre-decoding processing operations are stored in a non-transitory processor-readable medium, examples of which are described above. In an embodiment, the pre-decoding processing module 1914 derives a puncturing or shortening scheme from a puncturing or shortening scheme that is to be applied to a received codeword. Information indicative of bit positions and/or sub-channels that are affected by pre-decoding processing, or information from which such bit positions or sub-channels may be determined, may be fed back to the code processing module 1910, stored to the memory 1912, or otherwise made available to the code processing module 1910 by the pre-decoding processing module 1914.

In some embodiments of the code processing module 1910, the ordered sub-channel sequence may be determined based on information from the pre-decoding processing module 1914. For instance, the ordered sub-channel sequence may be determined based on the rate-matching scheme determined by the pre-decoding processing module 1914. Conversely, in some other embodiments, the pre-decoding processing module 1914 may determine a rate-matching scheme based on the coding parameters and/or the ordered sub-channel sequence determined by the code processing module 1910. In yet some other embodiments, the determinations made within the code processing module 1910 and pre-decoding processing module 1914 are jointly performed and optimized.

In some alternative embodiments, the functionality of the receiver module 1904, the decoder module 1906, the code processing module 1910, and/or the pre-decoding processing module 1914 described herein may be fully or partially implemented in software or modules, for example in receiving and decoding modules stored in a memory 1912 and executed by one or more processors of the apparatus 1900.

An apparatus could therefore include a processor, and a memory such as 1912, coupled to the processor, storing instructions which, when executed by the processor, cause the processor to perform the functionality and/or embodiments disclosed herein, or receiving/decoding operations corresponding to transmitting/encoding operations disclosed herein.

The apparatus 1900 could implement any of various other features that are disclosed herein. For example, the decoder module 1906, the receiver module 1904, the code processing module 1910, and/or the pre-decoding processing module 1914 could be configured to implement any one or more of receiving/decoding features corresponding to encoding/transmitting features disclosed herein.

Communication equipment could include the apparatus 1800, the apparatus 1900, or both a transmitter and a receiver and both an encoder and a decoder and other components shown in FIGS. 18 and 19. Such communication equipment could be user equipment or communication network equipment.

Figure 20:
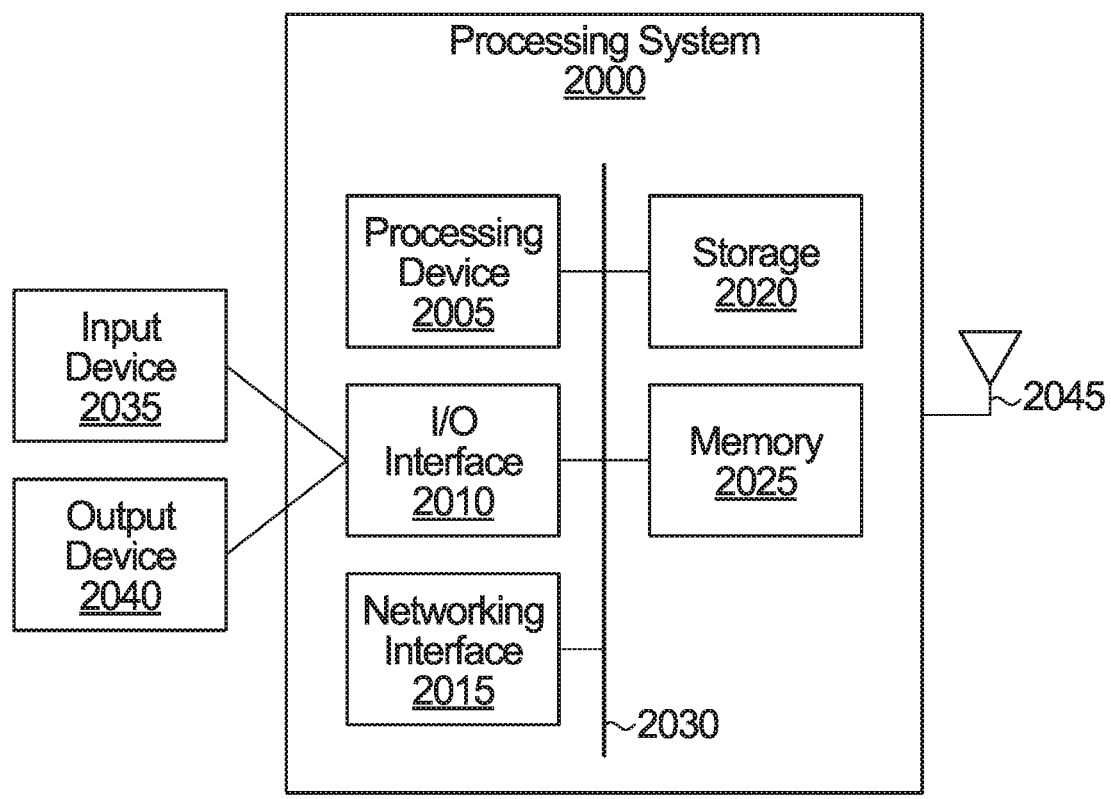
FIG. 20 is a block diagram of an example simplified processing system, which may be used to implement embodiments disclosed herein.

FIGS. 18 and 19 are generalized block diagrams of apparatus that could be used to implement embodiments disclosed herein. FIG. 20 is a block diagram of an example simplified processing system 2000, which may be used to implement embodiments disclosed herein, and provides a higher level implementation example. The apparatus 1800, the apparatus 1900, or both, may be implemented using the example processing system 2000, or variations of the processing system 2000. The processing system 2000 could be a server or a mobile device, for example, or any suitable processing system. Other processing systems suitable for implementing embodiments described in the present disclosure may be used, which may include components different from those discussed below. Although FIG. 20 shows a single instance of each component, there may be multiple instances of each component in the processing system 2000.

The processing system 2000 may include one or more processing devices 2005, such as a processor, a microprocessor, an ASIC, an FPGA, a dedicated logic circuitry, or combinations thereof. The processing system 2000 may also include one or more input/output (I/O) interfaces 2010, which may enable interfacing with one or more appropriate input devices 2035 and/or output devices 2040. The processing system 2000 may include one or more network interfaces 2015 for wired or wireless communication with a network (e.g., an intranet, the Internet, a P2P network, a WAN and/or a LAN) or other node. The network interfaces 2015 may include wired links (e.g., Ethernet cable) and/or wireless links (e.g., one or more antennas) for intra-network and/or inter-network communications. The network interfaces 2015 may provide wireless communication via one or more transmitters or transmit antennas and one or more receivers or receive antennas, for example. In this example, a single antenna 2045 is shown, which may serve as both transmitter and receiver. However, in other examples there may be separate antennas for transmitting and receiving. The processing system 2000 may also include one or more storage units 2020, which may include a mass storage unit such as a solid state drive, a hard disk drive, a magnetic disk drive and/or an optical disk drive.

The processing system 2000 may include one or more memories 2025, which may include a volatile or non-volatile memory (e.g., a flash memory, a random access memory (RAM), and/or a read-only memory (ROM)). The non-transitory memories 2025 may store instructions for execution by the processing devices 2005, such as to carry out examples described in the present disclosure. The memories 2025 may include other software instructions, such as for implementing an operating system and other applications/functions. In some examples, one or more data sets and/or modules may be provided by an external memory (e.g., an external drive in wired or wireless communication with the processing system 2000) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 2030 providing communication among components of the processing system 2000. The bus 2030 may be any suitable bus architecture including, for example, a memory bus, a peripheral bus or a video bus. In FIG. 20, the input devices 2035 (e.g., a keyboard, a mouse, a microphone, a touchscreen, and/or a keypad) and output devices 2040 (e.g., a display, a speaker and/or a printer) are shown as external to the processing system 2000. In other examples, one or more of the input devices 2035 and/or the output devices 2040 may be included as a component of the processing system 2000.

Figure 21:
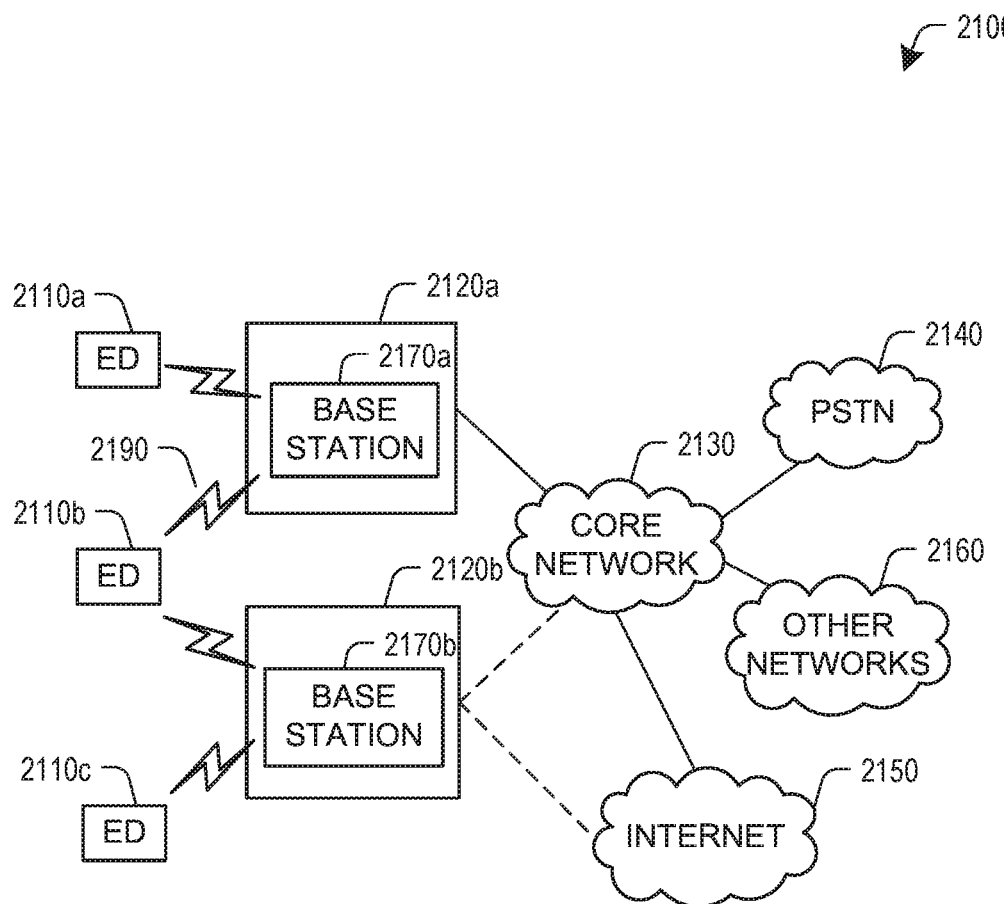
FIG. 21 illustrates an example communication system in which embodiments of the present disclosure could be implemented.

FIG. 21 illustrates an example communication system 2100 in which embodiments of the present disclosure could be implemented. In general, the communication system 2100 enables multiple wireless or wired elements to communicate data and other content. The purpose of the communication system 2100 may be to provide content (voice, data, video, text) via broadcast, narrowcast, user device to user device, etc. The communication system 2100 may operate by sharing resources such as bandwidth.

In this example, the communication system 2100 includes electronic devices (ED) 2110a-2110c, radio access networks (RANs) 2120a-2120b, a core network 2130, a public switched telephone network (PSTN) 2140, the internet 2150, and other networks 2160. Although certain numbers of these components or elements are shown in FIG. 21, any reasonable number of these components or elements may be included.

The EDs 2110a-2110c and base stations 2170a-2170b are examples of communication equipment that can be configured to implement some or all of the functionality and/or embodiments described herein. For example, any one of the EDs 2110a-2110c and base stations 2170a-2170b could be configured to implement the encoding or decoding functionality (or both) described above. In another example, any one of the EDs 2110a-2110c and base stations 2170a-2170b could include an apparatus 1800 (FIG. 18), an apparatus 1900 (FIG. 19), or both.

The EDs 2110a-2110c are configured to operate, communicate, or both, in the communication system 2100. For example, the EDs 2110a-2110c are configured to transmit, receive, or both via wireless or wired communication channels. Each ED 2110a-2110c represents any suitable end user device for wireless operation and may include such devices (or may be referred to) as a user equipment/device (UE), wireless transmit/receive unit (WTRU), mobile station, fixed or mobile subscriber unit, cellular telephone, station (STA), machine type communication (MTC) device, personal digital assistant (PDA), smartphone, laptop, computer, tablet, wireless sensor, or consumer electronics device.

In FIG. 21, the RANs 2120a-2120b include base stations 2170a-2170b, respectively. Each base station 2170a-2170b is configured to wirelessly interface with one or more of the EDs 2110a-2110c to enable access to any other base station 2170a-2170b, the core network 2130, the PSTN 2140, the Internet 2150, and/or the other networks 2160. For example, the base stations 2170a-2170b may include (or be) one or more of several well-known devices, such as a base transceiver station (BTS), a Node-B (NodeB), an evolved NodeB (eNodeB), a Home eNodeB, a gNodeB, a transmission point (TP), a site controller, an access point (AP), or a wireless router. Any ED 2110a-2110c may be alternatively or additionally configured to interface, access, or communicate with any other base station 2170a-2170b, the internet 2150, the core network 2130, the PSTN 2140, the other networks 2160, or any combination of the preceding. The communication system 2100 may include RANs, such as RAN 2120b, wherein the corresponding base station 2170b accesses the core network 2130 via the internet 2150, as shown.

The EDs 2110a-2110c and base stations 2170a-2170b are examples of communication equipment that can be configured to implement some or all of the functionality and/or embodiments described herein. In the embodiment shown in FIG. 21, the base station 2170a forms part of the RAN 2120a, which may include other base stations, base station controller(s) (BSC), radio network controller(s) (RNC), relay nodes, elements, and/or devices. Any base station 2170a, 2170b may be a single element, as shown, or multiple elements, distributed in the corresponding RAN, or otherwise. Also, the base station 2170b forms part of the RAN 2120b, which may include other base stations, elements, and/or devices. Each base station 2170a-2170b transmits and/or receives wireless signals within a particular geographic region or area, sometimes referred to as a "cell" or "coverage area". A cell may be further divided into cell sectors, and a base station 2170a-2170b may, for example, employ multiple transceivers to provide service to multiple sectors. In some embodiments, there may be established pico or femto cells where the radio access technology supports such. In some embodiments, multiple transceivers could be used for each cell, for example using multiple-input multiple-output (MIMO) technology. The number of RAN 2120a-2120b shown is exemplary only. Any number of RAN may be contemplated when devising the communication system 2100.

The base stations 2170a-2170b communicate with one or more of the EDs 2110a-2110c over one or more air interfaces 2190 using wireless communication links e.g. RF, microwave, infrared (IR), etc. The air interfaces 2190 may utilize any suitable radio access technology. For example, the communication system 2100 may implement one or more channel access methods, such as code division multiple access (CDMA), time division multiple access (TDMA), frequency division multiple access (FDMA), orthogonal FDMA (OFDMA), or single-carrier FDMA (SC-FDMA) in the air interfaces 2190.

A base station 2170a-2170b may implement Universal Mobile Telecommunication System (UMTS) Terrestrial Radio Access (UTRA) to establish an air interface 2190 using wideband CDMA (WCDMA). In doing so, the base station 2170a-2170b may implement protocols such as HSPA, HSPA+ optionally including HSDPA, HSUPA or both. Alternatively, a base station 2170a-2170b may establish an air interface 2190 with Evolved UTMS Terrestrial Radio Access (E-UTRA) using LTE, LTE-A, and/or LTE-B. It is contemplated that the communication system 2100 may use multiple channel access functionality, including such schemes as described above. Other radio technologies for implementing air interfaces include IEEE 802.11, 802.15, 802.16, CDMA2000, CDMA2000 1x, CDMA2000 EV-DO, IS-2000, IS-95, IS-856, GSM, EDGE, and GERAN. Of course, other multiple access schemes and wireless protocols may be utilized.

The RANs 2120a-2120b are in communication with the core network 2130 to provide the EDs 2110a-2110c with various services such as voice, data, and other services. The RANs 2120a-2120b and/or the core network 2130 may be in direct or indirect communication with one or more other RANs (not shown), which may or may not be directly served by core network 2130, and may or may not employ the same radio access technology as RAN 2120a, RAN 2120b or both. The core network 2130 may also serve as a gateway access between (i) the RANs 2120a-2120b or EDs 2110a-2110c or both, and (ii) other networks (such as the PSTN 2140, the internet 2150, and the other networks 2160). In addition, some or all of the EDs 2110a-2110c may include functionality for communicating with different wireless networks over different wireless links using different wireless technologies and/or protocols. Instead of wireless communication (or in addition thereto), the EDs 2110a-2110c may communicate via wired communication channels to a service provider or switch (not shown), and to the internet 2150. PSTN 2140 may include circuit switched telephone networks for providing plain old telephone service (POTS). Internet 2150 may include a network of computers and subnets (intranets) or both, and incorporate protocols, such as IP, TCP, UDP. EDs 2110a-2110c may be multimode devices capable of operation according to multiple radio access technologies, and incorporate multiple transceivers necessary to support such.

Figure 22A:
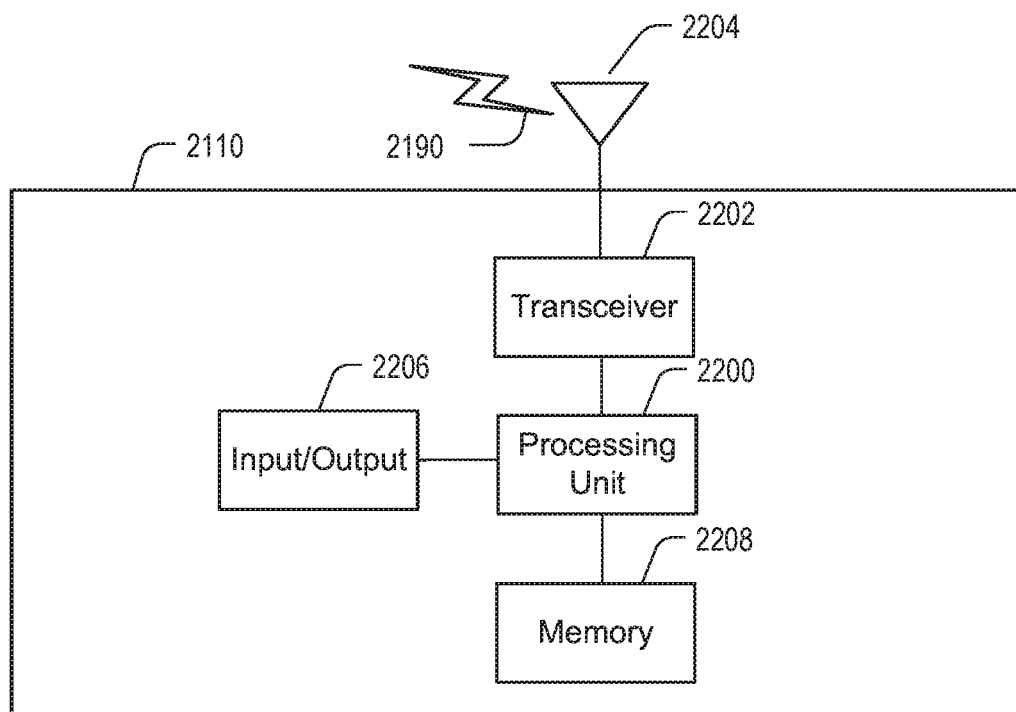
FIGS. 22A and 22B illustrate example devices that may implement the methods and teachings according to this disclosure.
Figure 22B:
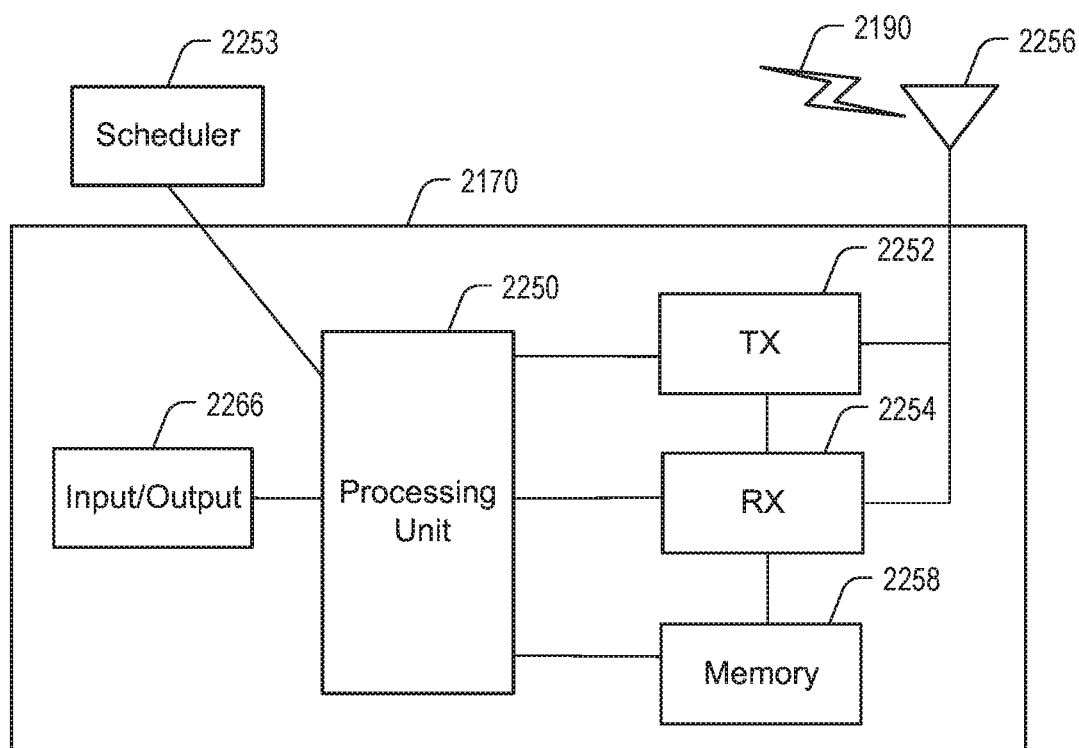

FIGS. 22A and 22B illustrate example devices that may implement the methods and teachings according to this disclosure. In particular, FIG. 22A illustrates an example ED 2110, and FIG. 22B illustrates an example base station 2170. These components could be used in the communication system 2100 or in any other suitable system.

As shown in FIG. 22A, the ED 2110 includes at least one processing unit 2200. The processing unit 2200 implements various processing operations of the ED 2110. For example, the processing unit 2200 could perform signal coding, data processing, power control, input/output processing, or any other functionality enabling the ED 2110 to operate in the communication system 2100. The processing unit 2200 may also be configured to implement some or all of the functionality and/or embodiments described in more detail above. Each processing unit 2200 includes any suitable processing or computing device configured to perform one or more operations. Each processing unit 2200 could, for example, include a microprocessor, microcontroller, digital signal processor, field programmable gate array, or application specific integrated circuit.

The ED 2110 also includes at least one transceiver 2202. The transceiver 2202 is configured to modulate data or other content for transmission by at least one antenna or Network Interface Controller (NIC) 2204. The transceiver 2202 is also configured to demodulate data or other content received by the at least one antenna 2204. Each transceiver 2202 includes any suitable structure for generating signals for wireless or wired transmission and/or processing signals received wirelessly or by wire. Each antenna 2204 includes any suitable structure for transmitting and/or receiving wireless or wired signals. One or multiple transceivers 2202 could be used in the ED 2110, and one or multiple antennas 2204 could be used in the ED 2110. Although shown as a single functional unit, a transceiver 2202 could also be implemented using at least one transmitter and at least one separate receiver.

The ED 2110 further includes one or more input/output devices 2206 or interfaces (such as a wired interface to the internet 2150). The input/output devices 2206 permit interaction with a user or other devices in the network. Each input/output device 2206 includes any suitable structure for providing information to or receiving information from a user, such as a speaker, microphone, keypad, keyboard, display, or touch screen, including network interface communications.

In addition, the ED 2110 includes at least one memory 2208. The memory 2208 stores instructions and data used, generated, or collected by the ED 2110. For example, the memory 2208 could store software instructions or modules configured to implement some or all of the functionality and/or embodiments described above and that are executed by the processing unit(s) 2200. Each memory 2208 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 22B, the base station 2170 includes at least one processing unit 2250, at least one transmitter 2252, at least one receiver 2254, one or more antennas 2256, at least one memory 2258, and one or more input/output devices or interfaces 2266. A transceiver, not shown, may be used instead of the transmitter 2252 and receiver 2254. A scheduler 2253 may be coupled to the processing unit 2250. The scheduler 2253 may be included within or operated separately from the base station 2170. The processing unit 2250 implements various processing operations of the base station 2170, such as signal coding, data processing, power control, input/output processing, or any other functionality. The processing unit 2250 can also be configured to implement some or all of the functionality and/or embodiments described in more detail above. Each processing unit 2250 includes any suitable processing or computing device configured to perform one or more operations. Each processing unit 2250 could, for example, include a microprocessor, microcontroller, digital signal processor, field programmable gate array, or application specific integrated circuit.

Each transmitter 2252 includes any suitable structure for generating signals for wireless or wired transmission to one or more EDs or other devices. Each receiver 2254 includes any suitable structure for processing signals received wirelessly or by wire from one or more EDs or other devices. Although shown as separate components, at least one transmitter 2252 and at least one receiver 2254 could be combined into a transceiver. Each antenna 2256 includes any suitable structure for transmitting and/or receiving wireless or wired signals. Although a common antenna 2256 is shown here as being coupled to both the transmitter 2252 and the receiver 2254, one or more antennas 2256 could be coupled to the transmitter(s) 2252, and one or more separate antennas 2256 could be coupled to the receiver(s) 2254. Each memory 2258 includes any suitable volatile and/or non-volatile storage and retrieval device(s) such as those described above in connection to the ED 2110. The memory 2258 stores instructions and data used, generated, or collected by the base station 2170. For example, the memory 2258 could store software instructions or modules configured to implement some or all of the functionality and/or embodiments described above and that are executed by the processing unit(s) 2250.

Each input/output device 2266 permits interaction with a user or other devices in the network. Each input/output device 2266 includes any suitable structure for providing information to or receiving/providing information from a user, including network interface communications.

The previous description of some embodiments is provided to enable any person skilled in the art to make or use an apparatus, method, or processor readable medium according to the present disclosure.

The present disclosure relates in part to a new method of encoding bits which is recursive and based on a chaining matrix. A resultant code and coding scheme could improve on the performance of current channel codes.

Some embodiments propose a new method of encoding data, which is based on recursive construction of the generator matrix using a kernel and a chaining matrix. Given an z×z kernel F, in a first operation a generator matrix is constructed using the Kronecker product of F and a smaller $$\frac{N}{z} \times \frac{N}{z}$$

generator matrix. A second operation involves applying a chaining matrix by multiplying certain sub-block matrices of the base matrix obtained in the first operation by the chaining matrix. These constructed codes can result in superior performance to polar codes. This is achieved by strengthening the polarization phenomenon by introducing the chaining matrix. An encoding apparatus is also proposed to implement the proposed coding scheme. Other embodiments are also disclosed.

Various modifications to the embodiments described herein may be readily apparent to those skilled in the art, and the generic principles of the methods and devices described herein may be applied to other embodiments. Thus, the present disclosure is not intended to be limited to the embodiments shown herein but is to be accorded the widest scope consistent with the principles and novel features disclosed herein.

For example, although embodiments are described primarily with reference to bits, other embodiments may involve non-binary multi-bit symbols. If one sub-channel can transmit more than one bit, then several bits can be combined into a symbol in a defined alphabet, and a non-binary symbol is encoded for each sub-channel. Accordingly, polarization kernels are not limited to binary kernels. Symbol-level (Galois field) or non-binary kernels are also contemplated. A non-binary kernel could be preferred for its higher degree of polarization than a binary kernel. However, decoding computation complexity is higher for a non-binary kernel, because a decoder would handle symbols rather than bits.

Non-binary kernels possess characteristics of binary kernels. Furthermore, non-binary kernels could be combined or cascaded with binary kernels to form one polar code.

As noted above, polar codes have been selected for uplink and downlink eMBB control channel coding for the new 5G air interface, also known as 5G new radio (NR). The techniques disclosed herein could be used not only for control data over a control channel but also or instead other types of data (e.g. user data) over any type of channel (e.g. a data channel).

Illustrative examples described herein refer to sub-channel sequences that are in increasing order of a reliability metric. In other embodiments, ordered sequences that are in decreasing reliability order could be used. Similarly, sequences could be generated in increasing order of reliability rather than starting with more reliable channels and building a sequence by adding sub-channels with progressively decreasing reliabilities.

Regarding generator matrices, the present disclosure is also not restricted to any particular generator matrix representation. Examples above include the following:

$$G_N = C_N \begin{bmatrix} G_{N/2} & 0 \\ 0 & G_{N/2} \end{bmatrix} P_N$$

$$G_N = \begin{bmatrix} G_{N/3} & 0 & 0 \\ 0 & G_{N/3} & 0 \\ C_{N/3} G_{N/3} & C_{N/3} G_{N/3} & G_{N/3} \end{bmatrix}$$

$$G_N = \begin{bmatrix} G_{N/2} & 0 \\ (F^{\otimes (n-1)})^T G_{N/2} & G_{N/2} \end{bmatrix}$$

$$G_N = \begin{bmatrix} G_{N/4} & G_{N/4} & G_{N/4} & 0 \\ \alpha G_{N/4} & \alpha^2 G_{N/4} & C_{N/4} G_{N/4} & 0 \\ \alpha^2 G_{N/4} & \alpha C_{N/4} G_{N/4} & G_{N/4} & 0 \\ C_{N/4} G_{N/4} & G_{N/4} & G_{N/4} & G_{N/4} \end{bmatrix}.$$

Another example is $$G_N = \begin{bmatrix} I_{N/2} & 0 \\ I_{N/2} + C_{N/2} & I_{N/2} \end{bmatrix} \begin{bmatrix} G_{N/2} & 0 \\ G_{N/2} & G_{N/2} \end{bmatrix},$$

and there could be others as well.

The present disclosure encompasses the following example embodiments, among others An example 1 relates to a method for generating and transmitting a codeword, the method comprising: encoding input bits according to a chained generator matrix to generate a codeword, the chained generator matrix comprising a first subset of entries corresponding to a first subset of entries in a base generator matrix for a chained polar code, and a second subset of entries that are different from a second subset of entries in the base generator matrix; transmitting the codeword.

An example 2 relates to the method of example 1, further comprising: applying a chaining matrix to the second subset of entries in the base generator matrix, to produce the second subset of entries in the chained generator matrix.

An example 3 relates to the method of example 1 or example 2, wherein the base generator matrix is based on a z-by-z kernel, wherein the entries in the base generator matrix comprise N/z-by-N/z matrices, and wherein the chained generator matrix is an N-by-N matrix.

An example 4 relates to the method of example 3, wherein z=2, N=$2^n$, and the chaining matrix is $(F^{\otimes(n-1)})^T$, where F is the kernel.

An example 5 relates to the method of any one of examples 1 to 4, further comprising: selecting the second subset of the entries based on a target row weight for the chained generator matrix.

An example 6 relates to the method of any one of examples 1 to 5, wherein the base generator matrix is based on a generator matrix that is smaller than the base generator matrix.

An example 7 relates to the method of any one of examples 1 to 5, further comprising: constructing the base generator matrix based on a generator matrix that is smaller than the base generator matrix.

An example 8 relates to the method of any one of examples 1 to 7, further comprising: constructing a further generator matrix based on the chained generator matrix; applying, to a subset of entries in the further generator matrix, a chaining matrix to construct a further chained generator matrix that is different from the further generator matrix.

An example 9 relates to the method of example 2, further comprising, in each of a plurality of iterations until a chained generator matrix of at least a target size is reached: constructing a further generator matrix based on a kernel and a chained generator matrix from a previous iteration; applying, to a subset of entries in the further generator matrix, a chaining matrix to construct a further chained generator matrix that is different from the further generator matrix.

An example 10 relates to the method of example 9, further comprising: storing to a memory the chained generator matrix from a final iteration.

An example 11 relates to the method of example 10, wherein the storing further comprises storing to the memory the chained generator matrix from each iteration before the final iteration.

An example 12 relates to the method of any one of examples 1 to 7, wherein non-zero entries in the base generator matrix comprise a common matrix, wherein the encoding comprises: applying to the common matrix respective parts of an input vector that includes the input bits; applying each of a subset of the respective parts of the input vector to a chaining matrix and the common matrix.

An example 13 relates to the method of example 12, further comprising: switching the common matrix and the chaining matrix between: a non-chained polar code matrix as the common matrix and an identity matrix as the chaining matrix; and a chained polar code matrix as the common matrix and a non-identity matrix as the chaining matrix.

An example 14 relates to a non-transitory processor-readable medium storing instructions which, when executed by one or more processors, cause the one or more processors to perform a method according to any one of examples 1 to 13.

An example 15 relates to an apparatus comprising: a processor; a memory coupled to the processor, the memory storing instructions which, when executed by the processor, cause the processor to perform a method according to any one of examples 1 to 13.

An example 16 relates to an apparatus for generating and transmitting a codeword, the apparatus comprising: an encoder to encode input bits according to a chained generator matrix to generate a codeword, the chained generator matrix comprising a first subset of entries corresponding to a first subset of entries in a base generator matrix for a chained polar code, and a second subset of entries that are different from a second subset of entries in the base generator matrix; a transmitter, coupled to the encoder, to transmit the codeword.

An example 17 relates to the apparatus of example 16, wherein the encoder is further configured to apply a chaining matrix to the second subset of entries in the base generator matrix, to produce the second subset of entries in the chained generator matrix.

An example 18 relates to the apparatus of example 16 or example 17, wherein the base generator matrix is based on a z-by-z kernel, wherein the entries in the base generator matrix comprise N/z-by-N/z matrices, and wherein the chained generator matrix is an N-by-N matrix.

An example 19 relates to the apparatus of example 18, wherein z=2, N=$2^n$, and the chaining matrix is $(F^{\otimes(n-1)})^T$, where F is the kernel.

An example 20 relates to the apparatus of any one of examples 16 to 19, wherein the encoder is further configured to select the second subset of the entries based on a target row weight for the chained generator matrix.

An example 21 relates to the apparatus of any one of examples 16 to 20, wherein the base generator matrix is based on a generator matrix that is smaller than the base generator matrix.

An example 22 relates to the apparatus of any one of examples 16 to 20, wherein the encoder is further configured to construct the base generator matrix based on a generator matrix that is smaller than the base generator matrix.

An example 23 relates to the apparatus of any one of examples 16 to 22, wherein the encoder is further configured to: construct a further generator matrix based on the chained generator matrix; and to apply, to a subset of entries in the further generator matrix, a chaining matrix to construct a further chained generator matrix that is different from the further generator matrix.

An example 24 relates to the apparatus of example 17, wherein the encoder is further configured to, in each of a plurality of iterations until a chained generator matrix of at least a target size is reached: construct a further generator matrix based on a kernel and a chained generator matrix from a previous iteration; and apply, to a subset of entries in the further generator matrix, a chaining matrix to construct a further chained generator matrix that is different from the further generator matrix.

An example 25 relates to the apparatus of example 24, further comprising: a memory, coupled to the encoder, wherein the encoder is further configured to store to the memory the chained generator matrix from a final iteration.

An example 26 relates to the apparatus of example 25, wherein the encoder is further configured to store to the memory the chained generator matrix from each iteration before the final iteration.

An example 27 relates to the apparatus of any one of examples 16 to 22, wherein non-zero entries in the base generator matrix comprise a common matrix, wherein the encoder is further configured to: apply to the common matrix respective parts of an input vector that includes the input bits; and apply each of a subset of the respective parts of the input vector to a chaining matrix and the common matrix.

An example 28 relates to the apparatus of example 27, wherein the encoder is further configured to switch the common matrix and the chaining matrix between: a non-chained polar code matrix as the common matrix and an identity matrix as the chaining matrix; and a chained polar code matrix as the common matrix and a non-identity matrix as the chaining matrix.

An example 29 relates to the apparatus of example 27, wherein the encoder comprises respective matrix multipliers to apply the respective parts of the input vector to the common matrix, and to apply each of the subset of the respective parts of the input vector to the chaining matrix and the common matrix.

An example 30 relates to the apparatus of example 29, further comprising a controller, coupled to the matrix multipliers, to switch the common matrix and the chaining matrix between: a non-chained polar code matrix as the common matrix and an identity matrix as the chaining matrix; and a chained polar code matrix as the common matrix and a non-identity matrix as the chaining matrix.

An example 31 relates to the apparatus of example 29, further comprising a controller, coupled to the matrix multipliers, to switch the common matrix between a chained polar code matrix and a non-chained polar code matrix, and to switch each of the subset of the respective parts of the input vector either: to a respective one of the multipliers to apply the chaining matrix when the common matrix is switched to a chained polar code matrix; or to bypass the respective one of the multipliers to bypass applying the chaining matrix to the input bits when the common matrix is switched to a non-chained polar code matrix.

An example 32 relates to user equipment comprising the apparatus of any one of examples 15 to 31.

An example 33 relates to communication network equipment comprising the apparatus of any one of examples 15 to 31.

The invention claimed is:

1. A method for error-correction enabled communication, the method comprising:
   encoding input bits according to a chained generator matrix to generate a codeword, the chained generator matrix being constructed recursively by, in each iteration:
      constructing the chained generator matrix for a current iteration by, using a first base generator matrix from a previous iteration, replacing a first subset of the nonzero entries of the first base generator matrix with entries of a second base generator matrix, and replacing a second subset of the nonzero entries of the first base generator matrix with entries of a third base generator matrix that is different from the second base generator matrix, the third base generator matrix being constructed by applying a chaining matrix to the second base generator matrix; and
      repeating the iterations until the chained generator matrix of a final iteration is of at least a target size; and
   transmitting the codeword.

2. The method of claim 1, wherein the first base generator matrix is based on a z-by-z kernel, wherein the second base generator matrix is a N/z-by-N/z matrix, and wherein the chained generator matrix is an N-by-N matrix.

3. The method of claim 2, wherein $z=2$, $N=2^n$, and the chaining matrix is $(F^{\otimes(n-1)})^T$, where F is the kernel.

4. The method of claim 1, further comprising:
   selecting the second subset of the nonzero entries based on a target row weight for the chained generator matrix of the final iteration.

5. The method of claim 1, further comprising:
   constructing a further generator matrix based on the chained generator matrix;
   applying, to a subset of entries in the further generator matrix, the chaining matrix to construct a further chained generator matrix that is different from the further generator matrix.

6. The method of claim 1, further comprising:
   storing to a memory the chained generator matrix from the final iteration.

7. The method of claim 6, wherein the storing further comprises storing to the memory the chained generator matrix from each iteration before the final iteration.

8. The method of claim 1, wherein non-zero entries in the first base generator matrix comprise a common matrix, wherein the encoding comprises:
   applying to the common matrix respective parts of an input vector that includes the input bits;
   applying each of a subset of the respective parts of the input vector to the chaining matrix and the common matrix.

9. The method of claim 8, further comprising:
   switching the common matrix and the chaining matrix between:
      a non-chained polar code matrix as the common matrix and an identity matrix as the chaining matrix; and
      a chained polar code matrix as the common matrix and a non-identity matrix as the chaining matrix.

10. A non-transitory processor-readable medium storing instructions which, when executed by one or more processors, cause the one or more processors to perform a method according to claim 1.

11. An apparatus comprising:
    a processor;
    a memory coupled to the processor, the memory storing instructions which, when executed by the processor, cause the processor to perform a method according to claim 1.

12. An apparatus for error-correction enabled communication, the apparatus comprising:
    an encoder to encode input bits according to a chained generator matrix to generate a codeword, the chained generator matrix being constructed recursively by, in each iteration:
       constructing the chained generator matrix for a current iteration by, using a first base generator matrix from a previous iteration, replacing a first subset of the nonzero entries of the first base generator matrix with entries of a second base generator matrix, and replacing a second subset of the nonzero entries of the first base generator matrix with entries of a third base generator matrix that is different from the second base generator matrix, the third base generator matrix being constructed by applying a chaining matrix to the second base generator matrix; and
       repeating the iterations until the chained generator matrix of a final iteration is of at least a target size; and
    a transmitter, coupled to the encoder, to transmit the codeword.

13. The apparatus of claim 12, wherein the first base generator matrix is based on a z-by-z kernel, wherein the second base generator matrix is a N/z-by-N/z matrix, and wherein the chained generator matrix is an N-by-N matrix.

14. The apparatus of claim 13, wherein $z=2$, $N=2^n$, and the chaining matrix is $(F^{\otimes(n-1)})^T$, where F is the kernel.

15. The apparatus of claim 12, wherein the encoder is further configured to select the second subset of the nonzero entries based on a target row weight for the chained generator matrix of the final iteration.

16. The apparatus of claim 12, wherein the encoder is further configured to:
construct a further generator matrix based on the chained generator matrix; and
apply, to a subset of entries in the further generator matrix, the chaining matrix to construct a further chained generator matrix that is different from the further generator matrix.

17. The apparatus of claim 12, further comprising:
a memory, coupled to the encoder,
wherein the encoder is further configured to store to the memory the chained generator matrix from the final iteration.

18. The apparatus of claim 17, wherein the encoder is further configured to store to the memory the chained generator matrix from each iteration before the final iteration.

19. The apparatus of claim 12, wherein non-zero entries in the first base generator matrix comprise a common matrix, wherein the encoder is further configured to:
apply to the common matrix respective parts of an input vector that includes the input bits; and
apply each of a subset of the respective parts of the input vector to the chaining matrix and the common matrix.

20. The apparatus of claim 19, wherein the encoder is further configured to switch the common matrix and the chaining matrix between: a non-chained polar code matrix as the common matrix and an identity matrix as the chaining matrix; and a chained polar code matrix as the common matrix and a non-identity matrix as the chaining matrix.

* * * * *